United States Patent
Nagaoka et al.

(10) Patent No.: US 6,768,167 B2
(45) Date of Patent: Jul. 27, 2004

(54) MIS SEMICONDUCTOR DEVICE AND THE MANUFACTURING METHOD THEREOF

(75) Inventors: Tatsuji Nagaoka, Nagano (JP); Tatsuhiko Fujihira, Nagano (JP); Yasuhiko Onishi, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/442,647

(22) Filed: May 21, 2003

(65) Prior Publication Data
US 2004/0056284 A1 Mar. 25, 2004

(30) Foreign Application Priority Data

May 21, 2002 (JP) ........................................ 2002-146863
Oct. 10, 2002 (JP) ........................................ 2002-298069

(51) Int. Cl.[7] ........................ H01L 29/76; H01L 21/336
(52) U.S. Cl. ........................ 257/329; 257/330; 257/331; 438/268; 438/270; 438/273
(58) Field of Search ........................ 257/329, 330, 257/331, 332, 333, 334, 287, 253; 438/268, 269, 270, 271, 272, 273

(56) References Cited

U.S. PATENT DOCUMENTS

| | | | | |
|---|---|---|---|---|
| 5,894,139 A | * | 4/1999 | Otsuki et al. ................ | 257/139 |
| 6,528,373 B2 | * | 3/2003 | Lipkin et al. ................ | 438/287 |
| 6,552,390 B2 | * | 4/2003 | Kameda ........................ | 257/335 |
| 6,621,132 B2 | * | 9/2003 | Onishi et al. ................ | 257/409 |
| 6,627,950 B1 | * | 9/2003 | Bulucea et al. ............. | 257/330 |

OTHER PUBLICATIONS

"Device Design of an Ion Implanted High Voltage MOSFET"; Yoshida et al.; Proc. of 6th Conf. on Solid State Devices, Tokyo, 1974; Supplement to the Journal of the Japan Society of Applied Physics, vol. 44, 1975; pp. 249–255.

"A High Power MOSFET with a Vertical Drain Electrode and a Meshed Gate Structure"; Yoshida et al.; IEEE Journal of Solid–State Circuits, vol. SC–11, No. 4; Aug. 1976; pp. 472–477.

* cited by examiner

*Primary Examiner*—Kevin M. Picardat
(74) *Attorney, Agent, or Firm*—Rossi & Associates

(57) ABSTRACT

A MIS semiconductor device has a greatly improved relation between the on-resistance and the switching time by forming trench completely through a p base region and positioning the trench adjacent to a gate electrode, and then implanting n-type impurity ions using the gate electrode as a mask to form a second drain region, which also serves as a drift region.

20 Claims, 21 Drawing Sheets

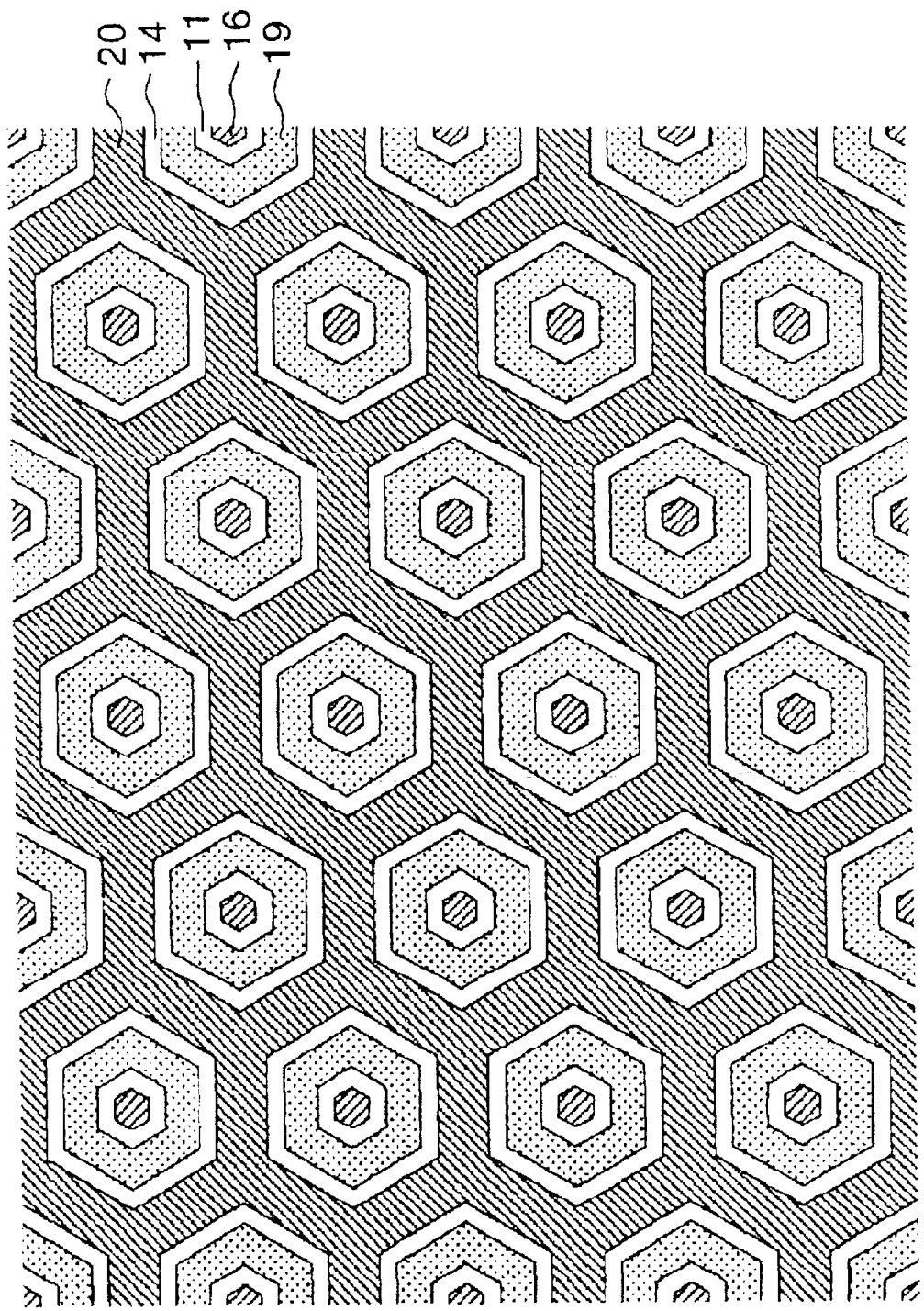

MIS SEMICONDUCTOR DEVICE AND THE MANUFACTURING METHOD THEREOF

BACKGROUND

A vertical DMOSFET has been known as a power MOSFET. See for instance U.S. Pat. No. 4,593,302. The vertical DMOSFET is comprised of a drift region of a first conductivity-type, epitaxially deposited on a semiconductor substrate of the first conductivity-type having low resistance, a gate electrode provided via a gate insulating film disposed on the surface of this drift region, a base region of a second conductivity type and a source region of the first conductivity-type formed by double diffusion, using the gate electrode as a mask, a source electrode that contacts both the source region and the base region, and a drain electrode formed on the rear surface of the substrate.

A trench MOSFET is also known. See for instance U.S. Pat. No. 4,941,026. The trench MOSFET is comprised of a drift region of the first conductivity type epitaxially deposited on a semiconductor substrate of the first conductivity-type having low resistance, a base region of a second conductivity-type disposed on the surface of this drift region, a source region of the first conductivity-type disposed on the surface of this base region, a trench that extends from the surface of this source region through the base region and reaching the drift region, a gate electrode disposed inside this trench via a gate insulating film, a source electrode that contacts both the source region and the base region, and a drain electrode formed on the rear surface of the substrate.

A lateral MOSFET is also known. See for instance *Device Design of an Ion Implanted High Voltage MOSFET* by Yoshida, et al., Supplement to the Journal of the Japan Society of Applied Physics, Vol. 44, pp. 249–255 (1975). The lateral power MOSFET is comprised of a gate electrode provided via a gate insulating film disposed on the surface of semiconductor substrate of a second conductivity-type that corresponds to the base region, a source region of the first conductivity-type and a relatively lightly doped drift region of the first conductivity-type formed by the self alignment technique using the gate electrode as a mask, a drain region of the first conductivity-type connected to this drift region, a source electrode, and a drain electrode. In a lateral power MOSFET, the source electrode and drain electrode coexist on the same surface of the semiconductor substrate. Therefore, the source electrode and drain electrode are each formed into a comb-tooth shape and are configured in an interdigital manner.

Additionally, a vertical-drain-electrode MOSFET (hereafter referred to as VDE-MOSFET) is known. See for instance *A High Power MOSFET with a Vertical Drain Electrode and a Meshed Gate Structure* by Yoshida, et al., IEEE Journal of Solid-State Circuits, Vol. SC-11, No. 4, pp. 472–477 (1976). The VDE-MOSFET is comprised of a base region disposed on the surface of a drain region of the first conductivity-type having low resistance, a gate electrode provided via a gate insulating film disposed on the surface of this base region, a source region of the first conductivity-type and a relatively lightly doped drift region of the first conductivity-type formed by the self alignment technique using the gate electrode as a mask, a drain diffusion region interconnected to the drift region and drain region, a source electrode that contacts both the source region and base region, and a drain electrode formed on the rear surface of the substrate.

However, in the above-noted conventional vertical DMOSFET, the on-resistance and the switching time thereof both depend upon the width of the area narrowed by the base region directly underneath the gate electrode. If this width is made narrower, the switching time will be shortened. If this width is made wider, the on-resistance will decrease. In other words, there is a tradeoff between the lower on-resistance and the higher speed switching. Therefore, it is difficult to achieve a level where both are satisfactory.

Moreover, in the above-noted conventional trench MOSFET, the on-resistance can be reduced to less than that of the vertical DMOSFET. However, the overlap area between the gate electrode and the drift region or the drain region will become considerably larger than that of the vertical DMOSFET. Furthermore, because this overlap area largely determines the switching time of a power MOSFET, the switching speed of a trench MOSFET will be slower than that of a vertical DMOSFET.

Moreover, in the above-noted conventional lateral power MOSFET, the aforementioned overlap area is smaller than that of the vertical DMOSFET by approximately a factor of ten. Therefore, it is advantageous for higher speed switching. However, the wiring resistance is large due to the comb-tooth shaped source electrode and drain electrode. Therefore, it is difficult to lower the on-resistance.

The above-noted conventional VDE-MOSFET is devised to decrease the wiring resistance, a drawback of the lateral power MOSFET, without impairing the high-speed switching characteristics of the lateral power MOSFET, and is able to decrease the on-resistance to approximately ⅕ that of the vertical DMOSFET. However, this level of low on-resistance is still insufficient and the realization of even lower on-resistance while maintaining high-speed switching characteristics is necessary.

Accordingly, there is still a need for a MIS semiconductor device and the manufacturing method thereof that greatly improve the relationship between the on-resistance and the switching time by maintaining high-speed switching characteristics while achieving lower on-resistance than in the past.

SUMMARY OF THE INVENTION

The present invention relates to MIS semiconductor devices and the manufacturing method thereof. Specifically, the MIS semiconductor devices have a gate formed of a metal (M), an insulator (I), and a semiconductor (S) structure. More specifically, the present invention relates to power MOSFETs and the manufacturing method thereof as representative MIS semiconductor devices for which low on-resistance and high-speed switching are desirable.

One aspect of the present invention is a MIS semiconductor device that includes a semiconductor substrate, a first drain region, a base region, a source region, a gate insulating film, a gate electrode, and a second drain region. It can also include a drift region.

The first drain region can be of a first conductivity-type provided on the first major side of the semiconductor substrate. The base region can be of a second conductivity-type provided on the second major side of the semiconductor substrate. The source region can be of the first conductivity-type selectively formed in the surface portion of the base region. The gate insulating film can be disposed on the surface of the base region, and the gate electrode provided on the gate insulating film. The second drain region, which can serve as drift region, can be disposed in the base region, adjacent to the gate electrode. The second drain region can extend from the surface of the base region to the first drain region, and can even extend completely through the first drain region to contact with a drain electrode formed on the first major side of the substrate.

The drift region can be of the first conductivity-type disposed in the surface portion of the base region. The second drain region can extending through the drift region. The gate electrode can be provided adjacent to the source region, and between the source region and the second drain region. The second drain region can be composed of a heavily doped semiconductor material of the first conductivity-type, a polycrystalline semiconductor material, or a metal.

The MIS device can include an insulation region in the second drain region and a highly conductive region embedded in the insulation region. The highly conductive region can contact the source electrode. The highly conductive region can be adapted to receive a gate potential. The thickness of the insulation region between the highly conductive region and the second drain region can be thicker than the thinnest part of the gate insulating film.

Another aspect of the present invention is a method of manufacturing the MIS semiconductor device. The method can include forming the base region, the source region, the gate insulating film, the gate electrode, and the second drain region, which can be formed by forming a trench through the base region, which trench extends from the second major side of the semiconductor substrate to the first drain region, adjacent to the gate electrode, and forming a second drain region in the trench. The second drain region can be aligned relative to the gate electrode and formed by implanting ions of an impurity of the first conductivity-type using the gate electrode as a mask.

The drift region can be formed on the surface portion of the base region before forming the trench. The trench can be formed through the drift region. The second drain region can be partly formed in the trench. The drift region can be aligned relative to the gate electrode and formed by implanting ions of an impurity of the first conductivity-type using the gate electrode as a mask.

BRIEF DESCRIPTION OF THE DRAWINGS

FIG. 21 is a plan view that illustrates a two-dimensional layout of the main part of the semiconductor device according to a seventeenth embodiment of the present invention.

DETAILED DESCRIPTION

Figure 1:
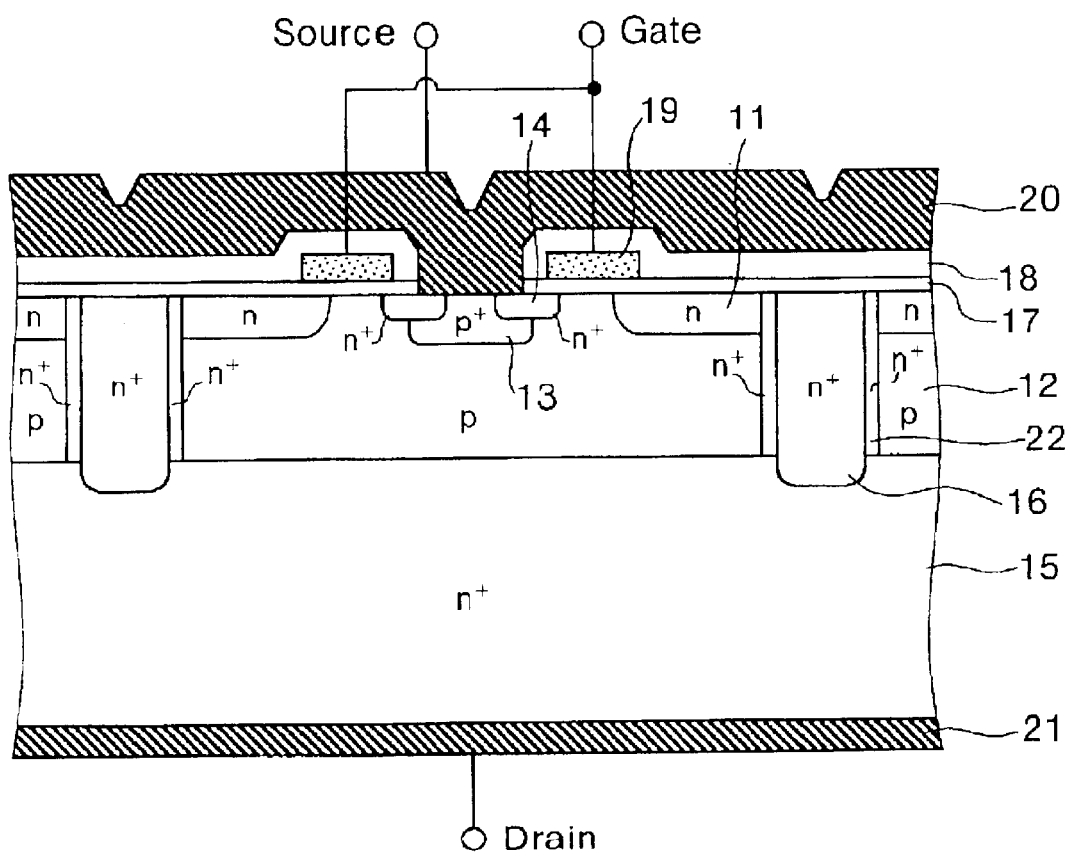
FIG. 1 is a cross-sectional view that illustrates the structure of the active part, through which the main current flows, of an n-channel power MOSFET according to a first embodiment of the present invention.

Below, preferred embodiments of the present invention will be described in detail with reference to drawings. In the following description and the drawings, layers and regions designated with an "n" or "p" indicate an electron or hole carrier, respectively. Moreover, a plus sign ("+") appended to an "n" or "p" indicates a relatively high impurity concentration. Additionally, while "n" is described as a first conductivity-type and "p" as a second conductivity-type, however, the first and second conductivity-type designation can be reversed. Furthermore, in a power MOSFET chip, a breakdown withstanding structure such as a guard ring or field plate can be provided chiefly to ensure the breakdown voltage of the edge region. Since those features are unrelated to the essence of the present invention, however, they have been omitted from the description and the drawings.

The inventors of the present invention have performed detailed research into the lowering of the on-resistance of the above-noted conventional VDE-MOSFET. The results have revealed that the drain diffusion region is the largest factor that inhibits the lowering of the on-resistance, and that the conventional drain diffusion region has the following two problems.

First, in the conventional VDE-MOSFET, the drain diffusion region is formed by the diffusion of impurities from the surface of the semiconductor device, but the drain diffusion region is deeper than the base region. Therefore, the impurity concentration in the deeper portion of the drain diffusion region decreases and the resistance between the drift region and drain region does not become sufficiently small. Moreover, because the impurities also diffuse laterally, the area occupied by the drain diffusion region in the semiconductor device surface will increase in size, and consequently, a sufficient level of cell integration cannot be achieved.

The present invention was devised based on the above-noted knowledge, and the MIS semiconductor device of the present invention is characterized by a trench formed at a position in the base region near the gate electrode, but on the side opposite to the source region, where the trench extends from the surface of the base region until a first drain region, and by a second drain region, which also serves as a drift region, disposed inside or along the sidewall of this trench and formed in a self-aligning manner in relation to the gate electrode by implanting the ions of an impurity of the first conductivity type using a mask employing the gate electrode as a part thereof.

Because the second drain region that also serves as a drift region is connected to the first drain region, the on-resistance decreases. Moreover, since the second drain region extends vertically, the drift region (namely, the second drain region) can be connected in a small area to the first drain region, and additionally, because the drift region and second drain region are combined, further reducing the area, a higher level of cell integration can be achieved, while substantially reducing the on-resistance.

Moreover, because it is unnecessary to form a drift region separately, fewer processes are involved as compared to where the second drain region and the drift region are provided separately. Furthermore, because the second drain region that also serves as a drift region is formed in a self-aligning manner, the area of overlap between the gate electrode and the drift region (in other words, the second drain region) can be reduced. Thus, the switching speed can be increased, and the fluctuation in the on-resistance and the switching speed is reduced. Additionally, the area per unit cell can be made smaller.

Furthermore, in the present invention, the second drain region can be constituted from a heavily doped semiconductor material of the first conductivity type. In such a case, the second drain region could be fabricated easily. Moreover, the present invention can have a structure where an insulation region is disposed inside the second drain region. This is effective in the cases where it is difficult to fill completely the inside of the trench with a semiconductor material of the first conductivity type.

Because the drift region and first drain region can be connected electrically via the second drain region that extends vertically, the drift region and the first drain region can be connected in a small area and with low resistance, thereby reducing the on-resistance. Moreover, because the drift region can be formed in a self-aligning manner, the area of overlap between the gate electrode and the drift region is decreased, the switching speed is increased, and the fluctuation in the on-resistance and the switching speed is reduced.

FIG. 1 is a cross-sectional view illustrating the structure of the active part, through which the main current flows, of an n-channel power MOSFET according to a first embodiment of the present invention. As illustrated in FIG. 1, a p base region 12 is formed on a first $n^+$ drain region 15 having low resistance. An $n^+$ source region 14 and an n drift region 11 are formed separately in the surface portion of the p base region 12. A gate electrode 19 is provided via a gate insulating film 17, such as a gate oxide film, above the surface portion of the p base region 12 between the $n^+$ source region 14 and the n drift region 11.

Moreover, a $p^+$ base region 13 that is deeper than the $n^+$ source region 14 is disposed in the p base region 12 on the side opposite the gate electrode 19, such that the $p^+$ base region 13 and the gate electrode 19 sandwich the $n^+$ source region 14. This $p^+$ base region 13 is helpful in protecting MOS structures when a high surge voltage is applied. In other words, when high-speed switching is performed, a high voltage surge is applied to the drain terminal due to the influence of parasitic inductance in the wiring or elsewhere. However, at that time, breakdown occurs in the p-n junction between the p base region 12, which is directly below the $p^+$ base region 13, and the first $n^+$ drain region 15. Consequently, surge energy is absorbed and the MOS structures are protected from damage.

Moreover, a second drain region 16 that electrically connects the n drift region 11 and the first $n^+$ drain region 15 is disposed inside the p base region 12. The second drain region 16 can be comprised of an $n^+$ semiconductor material, for example. In order to lower the on-resistance, the bottom of the second drain region 16 can contact the first $n^+$ drain region 15. Although there is no particular limit, the bottom of second drain region 16 can penetrate into the first $n^+$ drain region 15, as illustrated in FIG. 1. An $n^+$ punch-through stopper region 22 can be disposed between the p base region 12 and the second drain region 16 to suppress the depletion layer from expanding into the second drain region 16. Here, the second drain region 16 has an impurity concentration that is higher than the impurity concentration of the n drift region 11. Also, the $n^+$ punch-through stopper region 22 has an impurity concentration that is higher than the impurity concentration of the second drain region 16.

For example, the n drift region 11 can have an impurity concentration of $2.9 \times 10^{16}$ cm$^{-3}$, the second drain region 16 can have an impurity concentration of $1.2 \times 10^{19}$ cm$^{-3}$, and the $n^+$ punch-through stopper region 22 can have an impurity concentration of $2.0 \times 10^{19}$ cm$^{-3}$. Also, for example, the first $n^+$ drain region 15 can have an impurity concentration of $1.2 \times 10^{19}$ cm$^{-3}$ and the p base region 12 can have an impurity concentration of $1.5 \times 10^{16}$ cm$^{-3}$. Moreover, for example, the p base region 12 can be 3 µm deep, the n drift region 11 can be µm deep, and the $n^+$ punch-through stopper region 22 can be 0.5 µm thick.

In FIG. 1, reference number 18 indicates an insulating film that covers the gate electrode 19. Reference number 20 indicates a source electrode that contacts both the $n^+$ source region 14 and the $p^+$ base region 13. Reference number 21 indicates a drain electrode. In the present disclosure, the semiconductor substrate side on which the drain electrode 21 is disposed is designated as the first major surface and the side on which the source electrode 20 is disposed is designated as the second major surface.

The manufacturing process for an n-channel power MOSFET according to the first embodiment of the present invention follows. The present MOSFET can be made using conventional equipment for manufacturing conventional MOS semiconductor devices. During the formation of the second drain region 16, a mask having a desired window is formed on the second major surface of the semiconductor substrate, and then a trench is formed in the semiconductor material corresponding to the location of the window. At that time, the trench sidewall is orientated to be approximately or substantially perpendicular to the second major surface. Next, the $n^+$ semiconductor material is filled or formed into the trench through this window. According to the present manufacturing method, the second drain region 16 can be formed easily while conserving the surface area of the second major surface and achieving a higher level of cell integration, without adversely affecting the semiconductor regions, such as the p base region 12.

Moreover, using the gate electrode 19 as a part of the mask, impurities of the first conductivity-type can be ion-implanted from the second major surface side to form the n drift region 11 and the $n^+$ source region 14 in a self-aligning manner in relation to the gate electrode 19. According to the present method, the switching speed can be increased and the fluctuation in the on-resistance and switching speed can be reduced since the area of overlap between the gate electrode 19 and the n drift region 11 and the $n^+$ source region 14 can be reduced. Additionally, the area per unit cell can be made smaller.

Moreover, the p base region 12 can be formed by introducing impurities of the second conductivity type from the second major surface side of the semiconductor substrate having the first $n^+$ drain region 15. According to the present method, the fluctuation in the impurity concentrations of the p base region 12 and the n drift region 11 can be reduced as compared to the conventional manufacturing method that employs the epitaxial growth technique.

Operation of the n-channel power MOSFET of the first embodiment of the present invention follows. In a reverse bias blocking state, depletion layers expand from the respective p-n junctions between the p base region 12, which is at the same potential as the grounded source electrode 20, and the n drift region 11, between the p base region 12 and the $n^+$ punch-through stopper region 22, and between the p base region 12 and the first $n^+$ drain region 15, and the breakdown voltage determined by the depletion layer width and the electric field strength is ensured. At this time, if a depletion layer extends to a channel region, the capacitance of the portion of the gate insulating film, below which the depletion layer is extended, will act as feedback capacitance, decreasing the switching speed. Therefore, to achieve high-speed switching, it is desirable for the depletion layer to be within the n drift region 11 as much as possible. This is also applicable to other embodiments disclosed herein.

When the gate electrode 19 is biased at a potential positive in relation to the source electrode 20, an inversion layer forms via the gate oxide film 17 in the surface portion of the p base region 12, and this inversion layer operates as a channel. Then, electron carriers flow from the $n^+$ source region 14 through the channel to the n drift region 11, and further flow through the second drain region 16 and arrive at the drain electrode 21. This causes the device to enter the on state.

In the first embodiment, because the n drift region 11 is formed in a self-aligning manner by ion implantation that uses the gate electrode 19 as a part of the mask, the width of overlap between the gate electrode 19 and the n drift region 11 can be made small, on the order of 0.2 μm, for example. Therefore, because the capacitance between the gate and the source is extremely small, high-speed switching is possible. Moreover, the on-resistance is sufficiently low due to the existence of the heavily doped second drain region 16. Therefore, the relation between on-resistance and switching time is greatly improved and a MIS semiconductor device can be obtained in which high-speed switching characteristics are maintained, while on-resistance is low. The same effect is obtained in the cases when the second drain region 16 is a polycrystalline semiconductor or metal.

Figure 2:
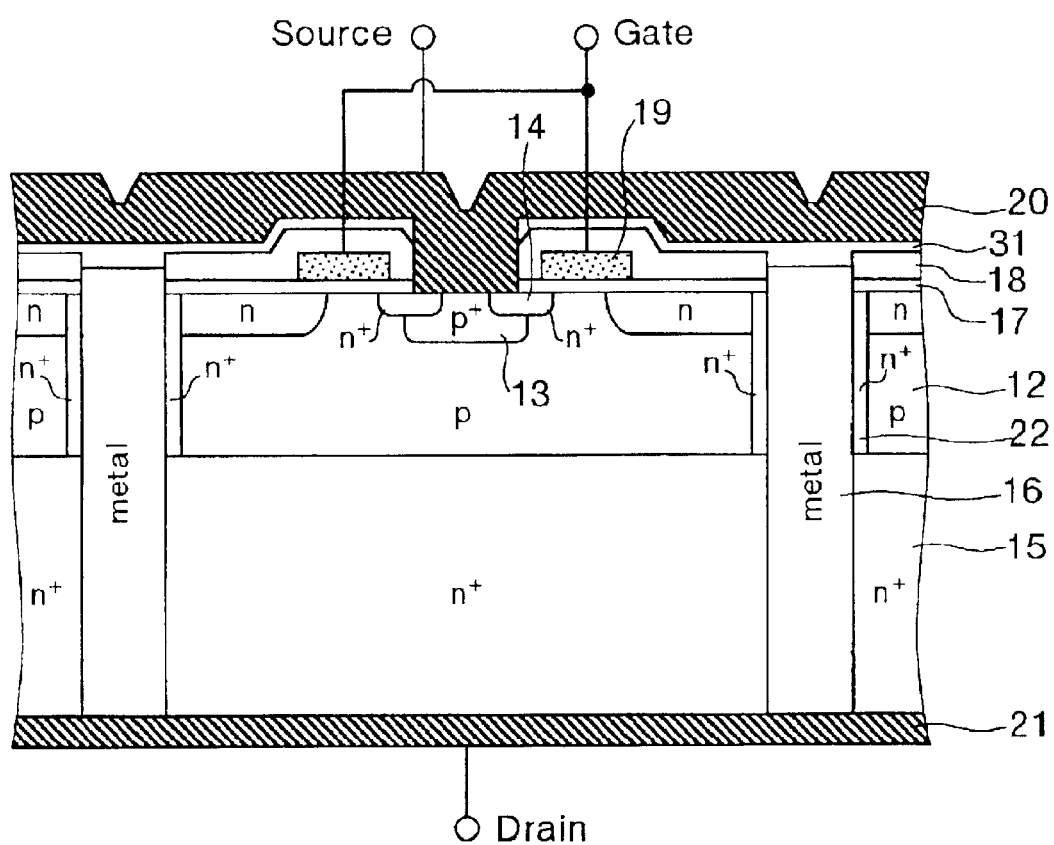
FIG. 2 is a cross-sectional view that illustrates the structure of the active part, through which the main current flows, of an n-channel power MOSFET according to a second embodiment of the present invention.

FIG. 2 is a cross-sectional view illustrating the structure of the active part, through which the main current flows, of an n-channel power MOSFET according to a second embodiment of the present invention. As illustrated in FIG. 2, the structure according to the second embodiment differs primarily from the structure according to the first embodiment illustrated in FIG. 1 in that a second drain region 16 is composed of metal, that the second drain region 16 penetrates through the p base region 12 and the first $n^+$ drain region 15 to contact the drain electrode 21 on the rear surface of the substrate, and that the second drain region 16 and the source electrode 20 are insulated by an insulating film 31. Other structures are the same as in the first embodiment. Here, if metal directly connects to the p base region 12, there is a risk of causing a leakage current between the drain and the source due to micro defects formed in the trench sidewall that forms the junction plane. However, in the second embodiment, the $n^+$ punch-through stopper region 22 formed between the second drain region 16 and the p base region 12 prevents such as a leakage.

In the second embodiment, during formation of the second drain region 16, a window is selectively formed in an insulating film 18 that covers the gate electrode 19, and a trench is formed using insulating film 18 as a mask in the semiconductor material corresponding to the location of the window. Next, metal is filled into the trench through this window. According to the present method of manufacturing, the metal second drain region 16 can be formed easily while conserving the surface area and achieving a higher level of cell integration, without adversely affecting semiconductor regions, such as the p base region 12.

Moreover, during formation of the source electrode 20, the insulating film 31 that covers the second drain region 16 is additionally laminated atop the insulating film 18 that covers the gate electrode 19. A window is selectively formed in this insulating film 31 and then portions of the source electrode 20 are laminated on the insulating film 31. According to the present method of manufacturing, the source electrode 20 that is insulated from the gate electrode 19 and the second drain region 16 can be formed easily. The operation of the n-channel power MOSFET according to the second embodiment is the same as that of the MOSFET according to the first embodiment.

Because the second drain region 16 is composed of metal, the second drain region 16 according to the second embodiment has a lower resistance as compared to the second drain region 16 of the first embodiment. Moreover, the first $n^+$ drain region 15 contributes less to the resistance component, because the second drain region 16 directly contacts the drain electrode 21. Therefore, a MIS semiconductor device can be obtained in which high-speed switching characteristics are maintained, while the on-resistance is lower than that of the MOSFET according to the first embodiment. In particular, the structure according to the second embodiment is extremely effective to decrease the on-resistance when it is difficult to make the first n+ drain region 15 of a thinner film. This is also applicable in the cases where the second drain region 16 is composed of an n+ semiconductor or polycrystalline semiconductor material.

Figure 3:
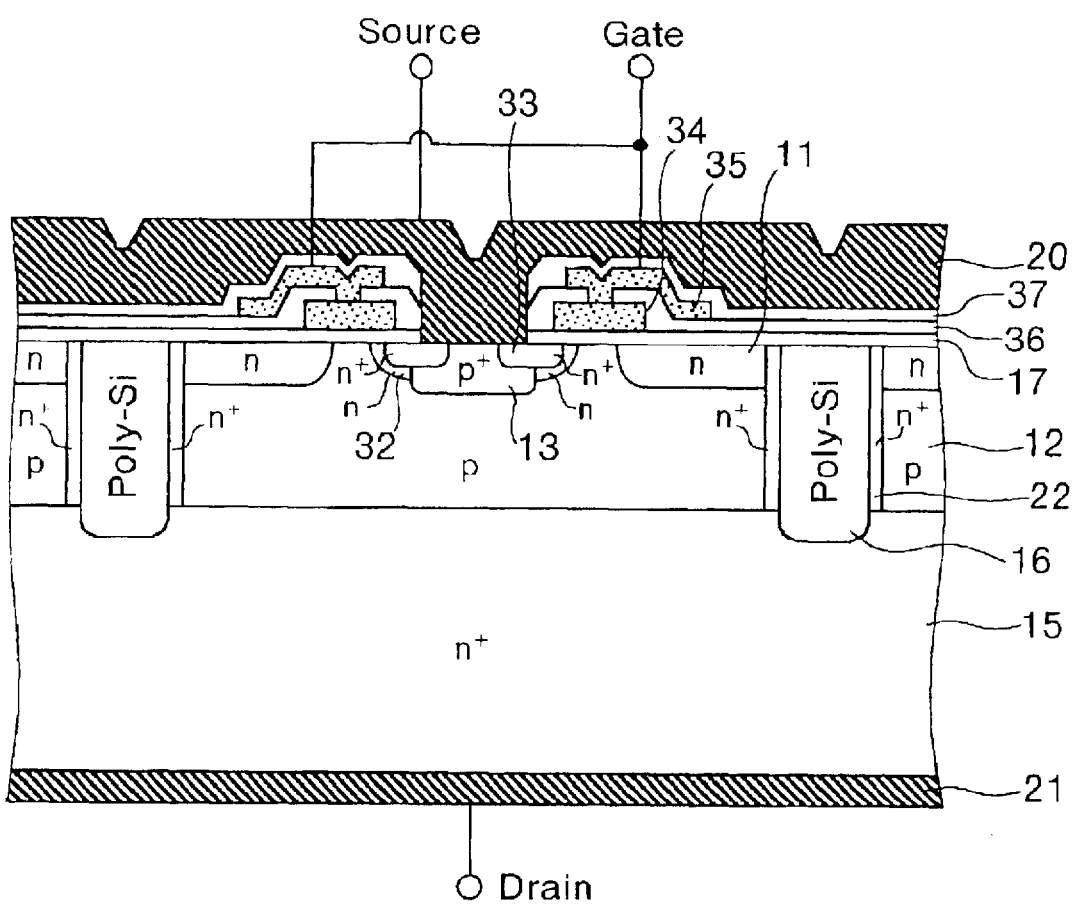
FIG. 3 is a cross-sectional view that illustrates the structure of the active part, through which the main current flows, of an n-channel power MOSFET according to a third embodiment of the present invention.

FIG. 3 is a cross-sectional view illustrating the structure of the active part, through which the main current flows, of an n-channel power MOSFET according to a third embodiment of the present invention. As illustrated in FIG. 3, the structure according to the third embodiment differs primarily from the structure of the first embodiment illustrated in FIG. 1 in the following three ways. Structures that are the same as in the first embodiment are assigned the same reference numbers as in the first embodiment and the description thereof is omitted.

The first difference is that the second drain region 16 according to the third embodiment is composed of a polycrystalline semiconductor material. The second difference is that the source region comprises a relatively lightly doped n semiconductor region 32 having approximately the same depth as the n drift region 11, and an n+ semiconductor region 33 doped relatively heavily and shallower than the n drift region 11. The third difference is that the gate electrode has a two-stage structure that is disposed between the gate electrode 32, 33 and the n drift region 11, and is comprised of a first gate electrode part 34 formed on the gate oxide film 17 and a second gate electrode part 35 formed on a thick oxide film part 36 comprised of an oxide film additionally laminated on the gate oxide film 17. The first gate electrode part 34 and the second gate electrode part 35 are connected. Moreover, the second gate electrode part 35 is insulated from the source electrode 20 by an insulating layer 37 that is laminated additionally on the second gate electrode part 35.

If the polycrystalline semiconductor material is directly connected to the p base region 12 in the similar manner as in the MOSFET according to the second embodiment, there is a risk of causing a leakage current between the drain and source due to micro defects formed in the trench sidewall that forms the junction plane. However, in the third embodiment as well, the n+ punch-through stopper region 22 prevents the occurrence of this leakage current. Since the operation of the n-channel power MOSFET according to the third embodiment is the same as that of the MOSFET according to the first embodiment, a detailed description thereof has been omitted.

According to the above-noted third embodiment, because the relatively lightly doped n semiconductor part 32 exists in the source region, the depletion layer is able to expand easily on the source region side. Therefore, the short channel effect caused by high voltage application can be inhibited. Moreover, because the second gate electrode part 35 that sandwiches the thick oxide film part 36 between itself and the n drift region 11 acts as a field plate for the n drift region 11, the electric field of the n drift region 11 in the proximity of the gate electrode is reduced and a higher breakdown voltage can be obtained.

Moreover, because expansion of the depletion layer is restricted on the side of the n drift region 11, the depletion layer range below the first gate electrode part 34 becomes narrower, and because the gate oxide capacitance, which contributes to the feedback capacitance, becomes smaller, the structure according to this embodiment is well suited for high-speed switching. Therefore, similar to the first and second embodiments, a MIS semiconductor device can be obtained with high-speed switching characteristics and low on-resistance. The same effect is obtained in the case where the second drain region 16 is composed of an n+ semiconductor material or metal.

The same effect can be obtained also in cases where the gate electrode has a structure having three or more stages. However, the capacitance of the insulating film existing underneath the second and subsequent stages of the gate electrode will act as a feedback capacitance, and therefore, it is desirable to make these capacitance components sufficiently small so as not to decrease the switching speed.

Figure 4:
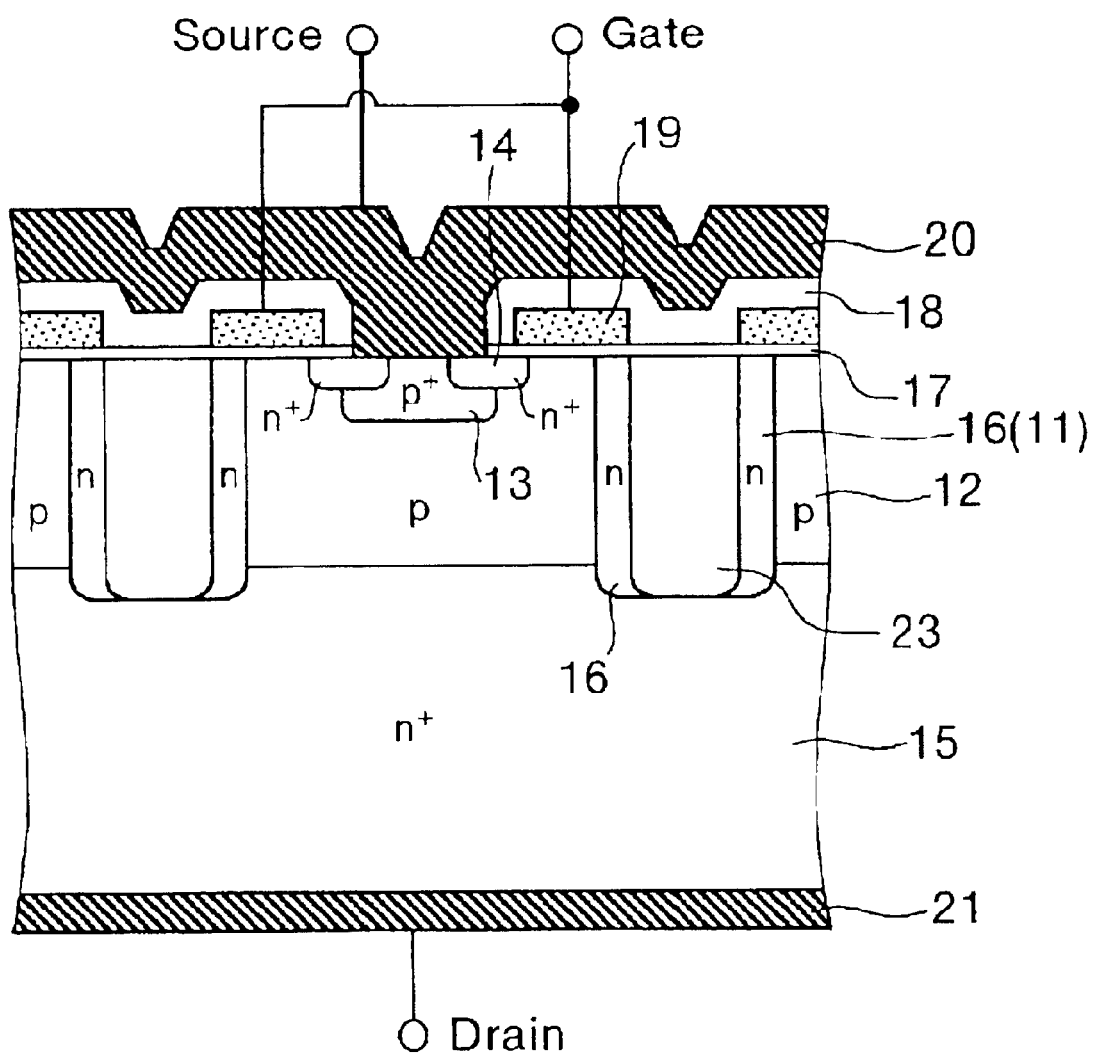
FIG. 4 is a cross-sectional view that illustrates the structure of the active part, through which the main current flows, of an n-channel power MOSFET according to a fourth embodiment of the present invention.

FIG. 4 is a cross-sectional view illustrating the structure of the active part, through which the main current flows, of an n-channel power MOSFET according to a fourth embodiment of the present invention. As illustrated in FIG. 4, the MOSFET according to the fourth embodiment differs primarily from the MOSFET according to the first embodiment illustrated in FIG. 1 in that the n drift region 11 and the second drain region 16 are integrally formed from an n+ semiconductor material along the trench sidewall, with the inside of the trench filled with an insulator 23, and there is no punch-through stopper region. Other structures are the same as in the first embodiment.

Here, if the n+ semiconductor material forming the second drain region 16, which also serves as the n drift region 11 adjoins the insulator 23, there is a risk of causing a leakage current between the drain and the source due to micro defects formed in the junction plane. To avoid this, in the fourth embodiment, the insulator 23 is composed of an oxide film. Accordingly, because the interface between the oxide film and the n+ semiconductor material is stabilized, a leakage current can be prevented. Furthermore, the leakage current can be prevented by using an n+ punch-through stopper region provided between the second drain region 16 and the p base region 12 as in the MOSFET according to the first embodiment.

The second drain region 16, which also serves as the n drift region 11, is formed in a self-aligning manner after the formation of the trench, using, for example, the gate electrode 19 as a part of the mask and implanting ions from the second major surface side toward the trench sidewall at an oblique angle. Accordingly, this formation is easy to carry out. Since the operation of the n-channel power MOSFET of the fourth embodiment is the same as that of the MOSFET according to the first embodiment, a description thereof has been omitted.

Since the n drift region 11 extends perpendicularly in relation to the substrate surface according to the fourth embodiment, the dimension of the substrate in the direction of its surface (lateral direction) can be made smaller, thereby enabling a higher cell density. Therefore, as in the case of the first embodiment, a MIS semiconductor device can be obtained with high-speed switching characteristics and low on-resistance. Moreover, because the inside of the trench is filled with the insulator 23, the filling process is easier to accomplish than in the case where filling is performed with a semiconductor material. Moreover, because the n drift region 11 and the second drain region 16 are both formed in the same process, the device can be made with fewer manufacturing steps and thus cost reduction as compared to the first embodiment.

Moreover, since there is no punch-through stopper region according to the fourth embodiment, the depletion layer will expand within the second drain region 16, ensuring a certain breakdown voltage. Additionally, in the case where the entire trench is filled with the n+ semiconductor material, it may be difficult to obtain a sufficient breakdown voltage because a non-depleted region will remain inside. However, the depletion layer is able to expand easily throughout the entire trench and a high breakdown voltage can be achieved according to the fourth embodiment because the non-depleted region is replaced by the insulator 23. The inventors of the present invention have verified by simulation that a breakdown voltage of approximately 50 V can be ensured easily according to the fourth embodiment.

Figure 5:
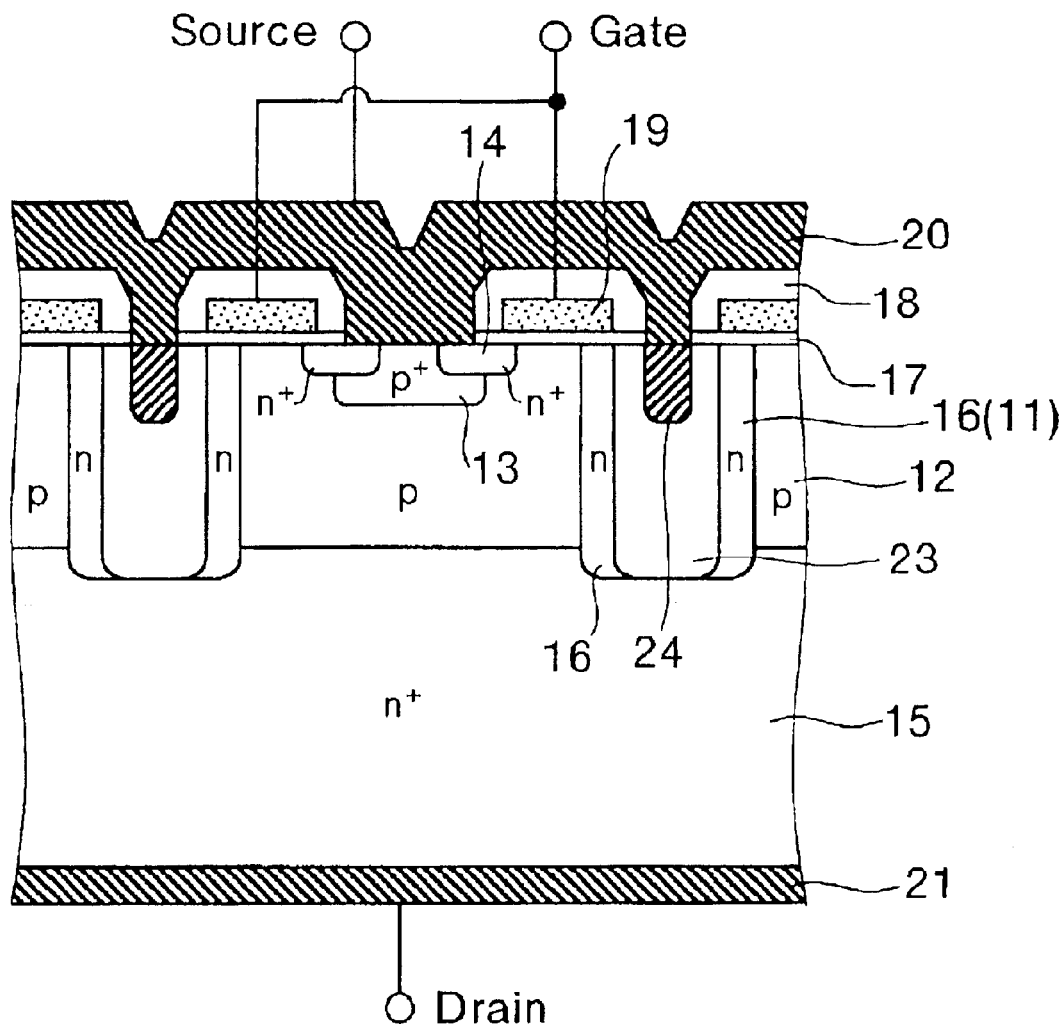
FIG. 5 is a cross-sectional view that illustrates the structure of the active part, through which the main current flows, of an n-channel power MOSFET according to a fifth embodiment of the present invention.

FIG. 5 is a cross-sectional view illustrating the structure of the active part, through which the main current flows, of an n-channel power MOSFET according to a fifth embodiment of the present invention. As illustrated in FIG. 5, the MOSFET according to the fifth embodiment has a structure wherein a portion of insulator 23 that fills the trench in the MOSFET according to the fourth embodiment illustrated in FIG. 4 is embedded with a highly conductive material 24, which is made to contact the source electrode 20 via a window formed in the insulating film 18 covering the gate electrode 19. The highly conductive material 24 is insulated from the gate electrode 19 and the second drain region 16 by the insulator 23

The region of the highly conductive material 24 is formed easily from one or more of the following: $n^+$ semiconductor material, $p^+$ semiconductor material, polycrystalline semiconductor material, metal, or a compound thereof, etc. For example, by forming a window through the insulator 18 covering the gate electrode 19, the highly conductive material 24 will be deposited at the same time as depositing the source electrode 20. That is, the source electrode 20 and the highly conductive material 24 can be made of the same material. Since the operation of the n-channel power MOSFET according to the fifth embodiment is the same as that of the MOSFET according to the first embodiment, a description thereof has been omitted.

According to the fifth embodiment, the depletion layer expands throughout the entire second drain region 16. Therefore, it is extremely easy to ensure the breakdown voltage, because the highly conductive material 24 acts as a field plate. Additionally, the highly conductive material 24 functions even more effectively as a field plate because highly conductive material 24 is biased at the source potential.

Here, it is desirable to reduce the area of overlap between the gate electrode 19 and the n drift region 11 to achieve high-speed switching. However, it is inevitable that the second drain region 16 will become narrow and the on-resistance will become larger in the MOSFET according to the fifth embodiment. Therefore, the impurity concentration of the second drain region 16 need to be made higher than that in the first through third embodiments to decrease the on-resistance. However, even in such a case, the depletion layer will expand, as noted above, sufficiently to the side of the second drain region 16 due to the field plate effect of the highly conductive material 24, thus ensuring the breakdown voltage.

By reducing the area of the overlap between the gate electrode 19 and the n drift region 11 to decrease the feedback capacitance, and by increasing the impurity concentration of the second drain region 16, the requirement for lower on-resistance can be satisfied at the same time, and thus RonXQgd can be dramatically improved. Here, Ron is the on-resistance and Qgd is the electrical charge quantity between the gate and drain.

The inventors of the present invention have performed a simulation on a MOSFET comprised of the p base region 12 having a width of 3.5 μm, thickness of 2.0 μm and impurity concentration of $8.0 \times 10^{15}$ cm$^{-3}$ provided on the first $n^+$ drain region 15 having an impurity concentration of $1.2 \times 10^{19}$ cm$^{-3}$, and the n drift region 11 and the second drain region 16 integrally formed as having a width of 0.2 μm and impurity concentration of $1.4 \times 10^{17}$ cm$^{-3}$. The simulation results indicate a breakdown voltage of 35 V and RonXQgd of 15 mΩnC. In other words, it has been verified that the feedback capacitance can be decreased while maintaining low on-resistance.

Furthermore, the highly conductive material 24 can be fixed at the gate potential. In this case, in order to avoid a switching speed decrease due to the capacitance of the insulator 23 interposed between the highly conductive material 24 and the second drain region 16, it is desirable for the thickness of the insulator 23 between the highly conductive material 24 and the second drain region 16 to be made thicker than the thinnest part of the gate oxide film (electrode) 17. Alternatively, it is desirable for the dielectric permeability of the insulator 23 interposed between the highly conductive material 24 and the second drain region 16 to be made smaller than the dielectric permeability of the gate oxide film (electrode) 17.

Figure 6:
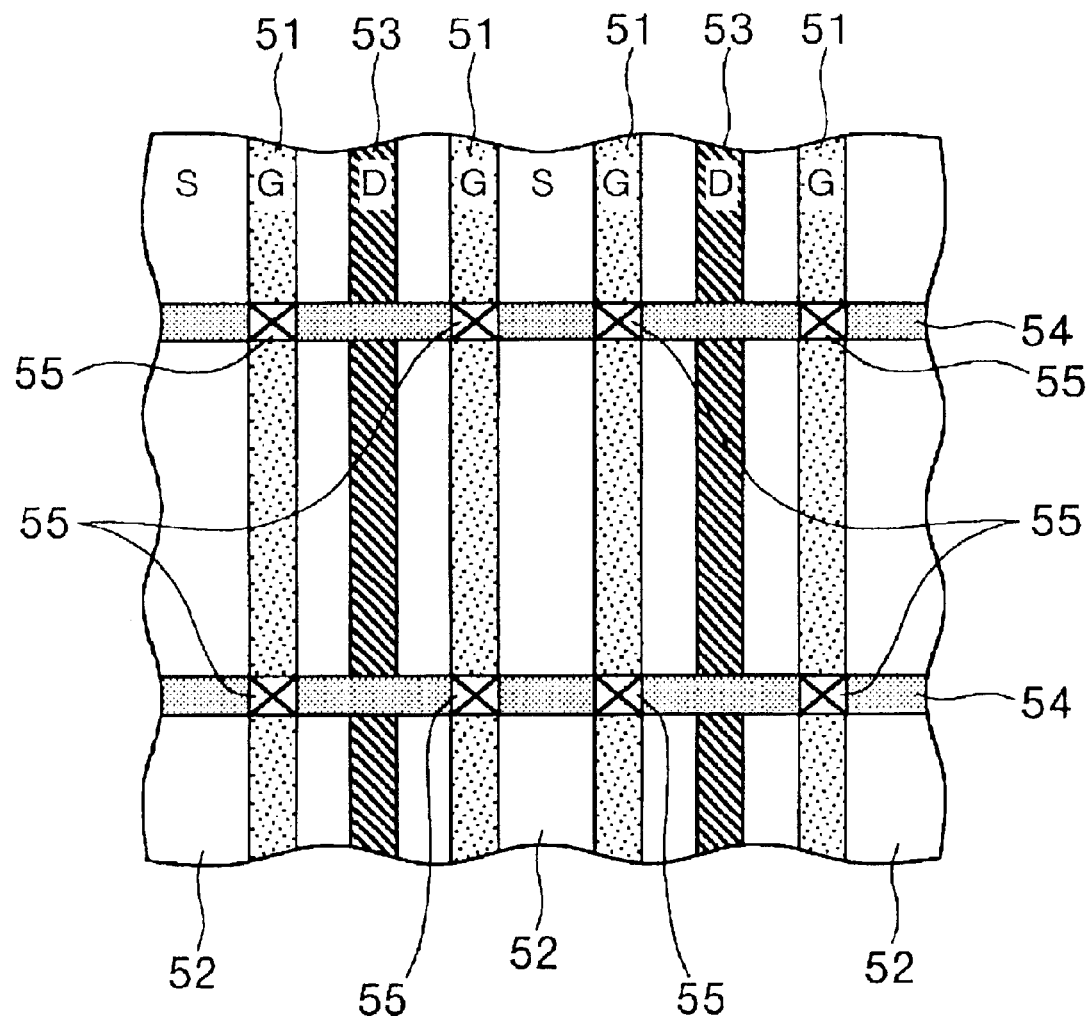
FIG. 6 is a plan view that illustrates an exemplary two-dimensional layout, as seen from the second major surface, of the gate, source, and drain of the semiconductor device according to a sixth embodiment of the present invention.

FIG. 6 is a plan view that illustrates a two-dimensional layout, as seen from the second major surface of the gate, source, and drain of each semiconductor device according to the first to fifth embodiments. In the first to fifth embodiments, the second drain region 16, which can be formed using a trench, undergoes almost no expansion due to diffusion. Accordingly, as illustrated in FIG. 6, the gate electrodes 51 indicated by reference letter G, the source regions 52 indicated by reference letter S, and the second drain regions 53 indicated by reference letter D are arranged as stripes. In this type of layout, because the loss area due to lateral diffusion is small, a higher cell density can be achieved than for an arrangement similar to the layout illustrated in FIG. 7. Thus, the on-resistance can be lowered.

However, if the chip area for the stripe arrangement illustrated in FIG. 6 becomes large, there is a risk of decreasing the switching speed due to the wiring resistance of the gate electrode 51. In order to prevent this, the MOSFET according to the sixth embodiment has a structure in which a plurality of gate wires 54 are provided that cross the plurality of gate electrodes 51 arranged as stripes, and each gate wire 54 makes contact with each gate electrode 51 at intersection points 55.

As an alternative to providing the gate wires 54, the resistance of the gate electrode 51 can be lowered by configuring the gate electrode 51 from a low resistance material, such as a metal or a metal-polycrystalline semiconductor compound, and/or by adopting a two-layer structure comprised of such low resistance material and polycrystalline semiconductor material. Moreover, it is even more effective to adopt a structure that uses both the gate electrode 51 configured from a low resistance material or having a two-layer structure of a low resistance material and polycrystalline semiconductor material, and the gate wire 54.

Figure 7:
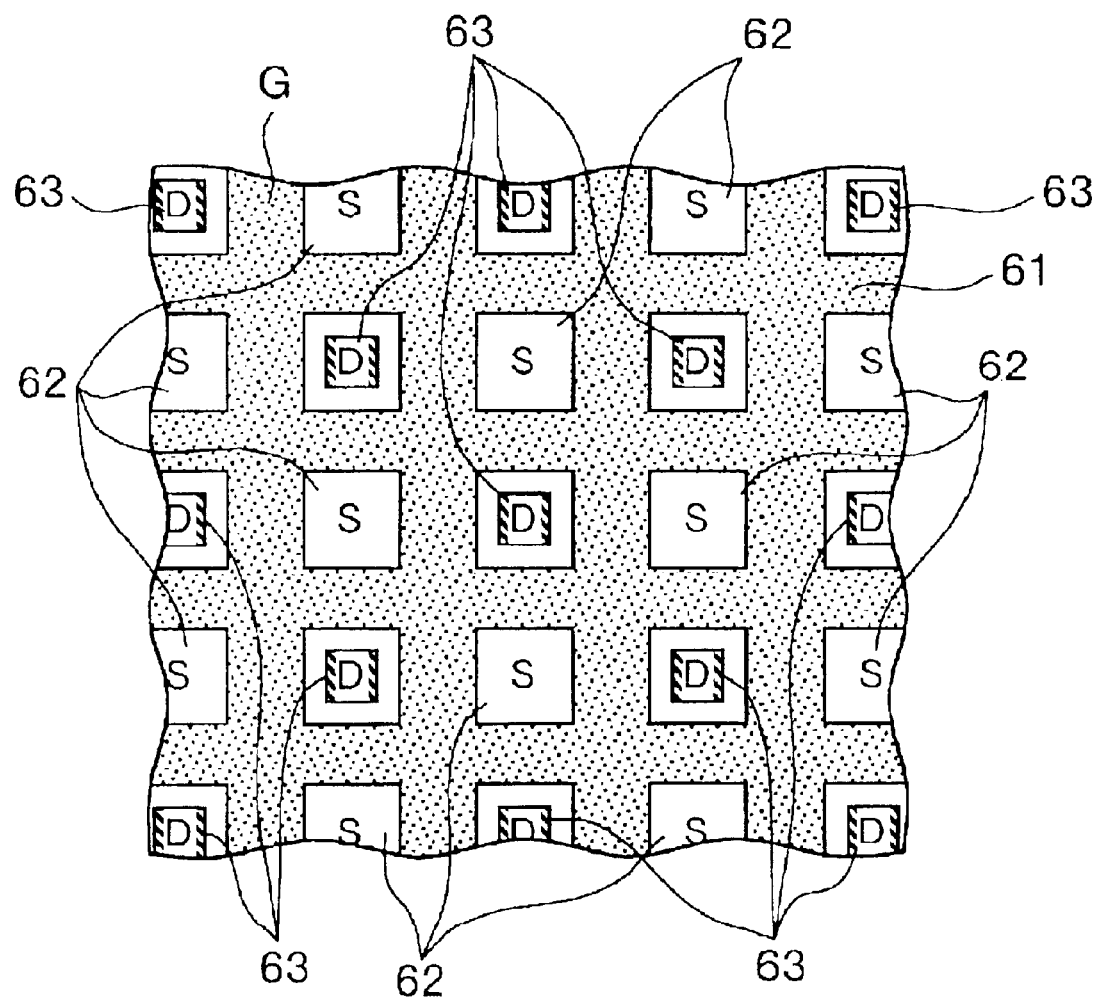
FIG. 7 is a plan view that illustrates another exemplary two-dimensional layout, as seen from the second major surface, of the gate, source, and drain of the semiconductor device according to the sixth embodiment of the present invention.

As illustrated in FIG. 7, a structure can also be used in which the gate electrode 61, indicated by reference letter G, has a meshed arrangement and the second drain region 63, indicated by reference letter D, has a checkerboard arrangement. Reference letter S indicates the source region 62. The perimeter of the second drain region 63 is an n drift region.

The seventh through seventeenth embodiments, which are illustrated as two-dimensional layout and end section configurations, are capable of sufficiently leveraging the effect of each semiconductor device according to any of the first through fifth embodiments. In the description of the MOSFETs according to the seventh through seventeenth embodiments, the structures that are the same are assigned the same reference numbers, and the structures that are the same as in each aforementioned embodiment are assigned the same reference numbers as in each aforementioned embodiment.

Figure 8:
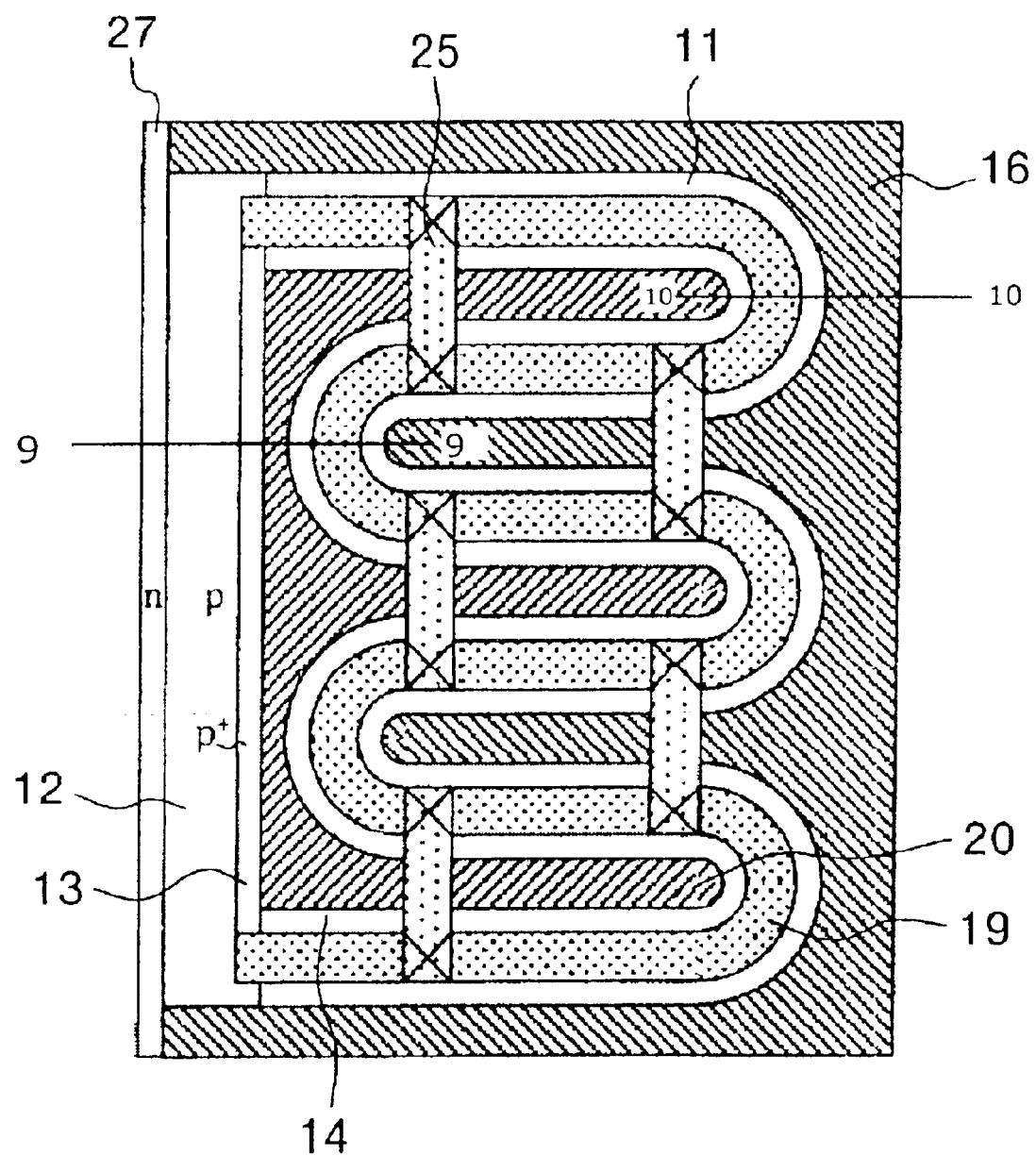
FIG. 8 is a plan view that illustrates an exemplary two-dimensional layout of the main part of the semiconductor device according to a seventh embodiment of the present invention.
Figure 9:
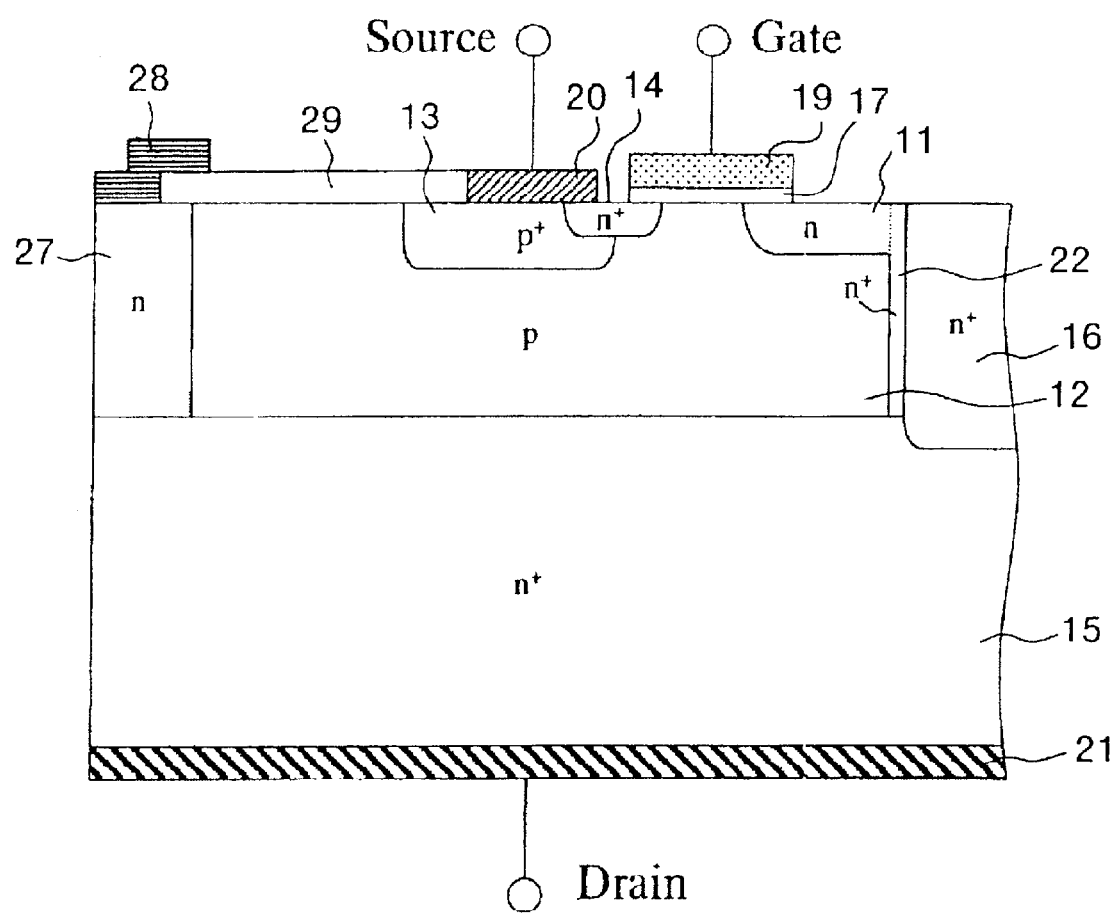
FIG. 9 is a cross-sectional view that illustrates the structure of the device end section along line segment 9—9 of FIG. 8.
Figure 10:
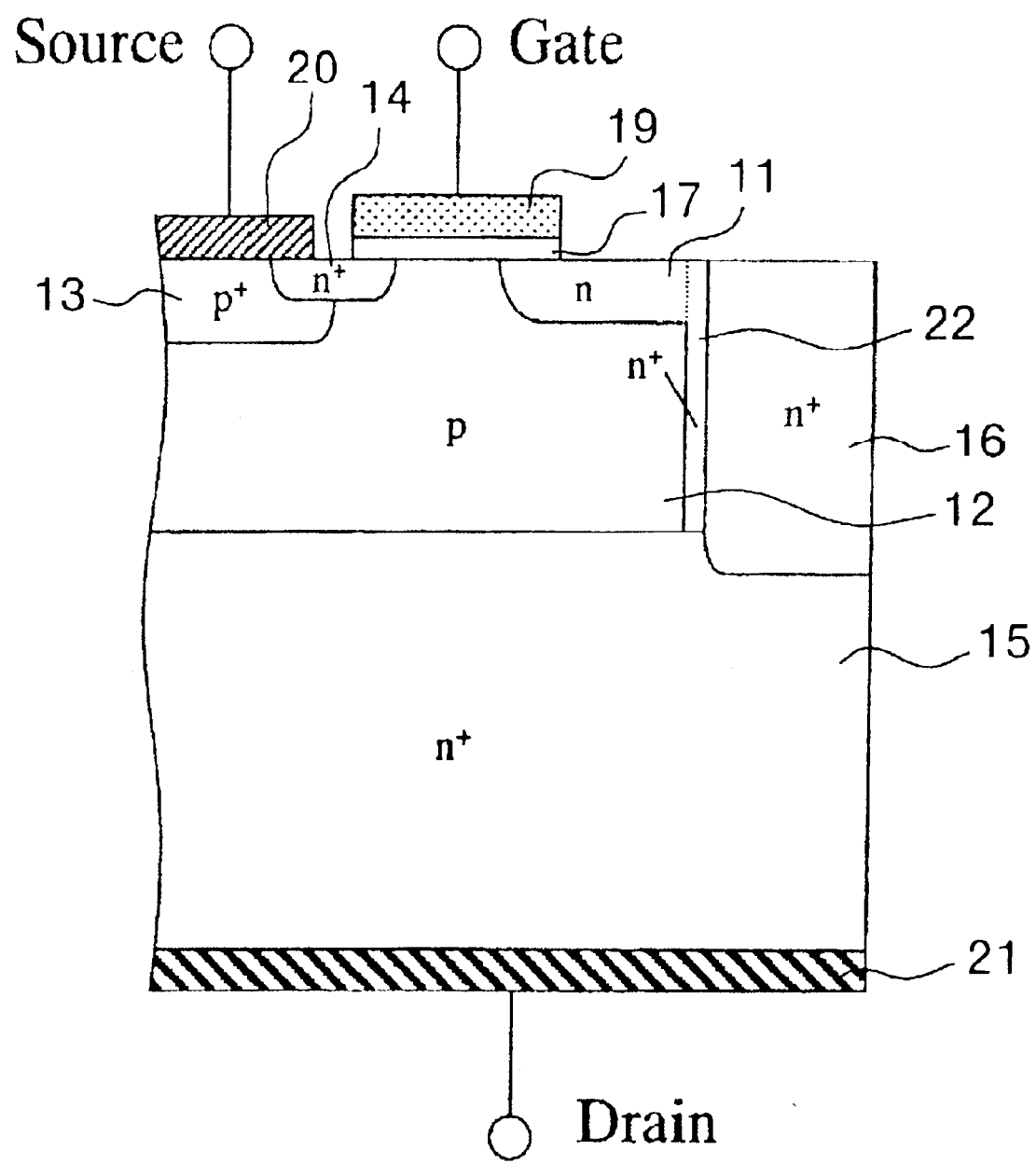
FIG. 10 is a cross-sectional view that illustrates the structure of the device end section along line segment 10—10 of FIG. 8.

FIG. 8 is a plan view that illustrates an exemplary two-dimensional layout of the main part of the semiconductor device according to a seventh embodiment of the present invention. FIGS. 9 and 10 are cross-sectional views that illustrate the structure of the device end section taken along line 9—9 and 10—10, respectively, of FIG. 8. The floating electrode 28 and insulating film 29 illustrated in FIGS. 9 and 10 are not shown in FIG. 8.

In a device whose two-dimensional shape is rectangular, for example, as illustrated in FIG. 8, the gate electrode 19 and the n drift region 11 and the n$^+$ source region 14, which are arranged so as to sandwich the gate electrode 19, are formed as having stripe-like shapes. Next, the ends of each stripe segment are curved or bent and connected to an adjoining segment. In other words, the gate electrode 19, the n drift region 11 and the n$^+$ source region 14 are continuous from one end to the other in a serpentine configuration to form an efficient MOSFET.

Moreover, as illustrated in FIGS. 8 and 9, an n outer periphery region 27 is provided on the edge of the outer periphery of the device facing the n$^+$ source region 14 (left edge in FIG. 8), and is separated from the n$^+$ source region 14 by the p base region 12. With this type of structure, a depletion layer expands quickly from the p-n junction formed between the p base region 12 and the n outer periphery region 27 during application of a breakdown voltage, ensuring a certain breakdown voltage between an active MOSFET and the edge of the device without incurring the influence of the edge effects. Moreover, this also reduces the electric field at the terminal end of the MOSFET.

Here, the n outer periphery region 27 is sufficiently removed from the n$^+$ source region 14 so that the depletion layer, which extends from the n outer periphery region 27 into the p base region 12 does not-reach the n$^+$ source region 14. Moreover; the n outer periphery region 27 has a sufficient width so that a non-depleted region will remain during application of a breakdown voltage. Also, a floating electrode 28 is provided in contact with the n outer periphery region 27, and both the floating electrode 28 and the non-depleted region will approximately be at the drain potential during application of a breakdown voltage. Consequently, the distribution of electric potential on the surface of the semiconductor device between the source electrode 20 and the floating electrode 28 is stabilized.

In FIG. 8, the region between the n$^+$ source region 14 and the p base region 12 is the source electrode 20. As illustrated in FIG. 9, in the outer periphery of the device, the source electrode 20 is arranged so that its side edges are inside the area surrounded by the side edge of the p$^+$ base 13. Basically, the configuration is such that an area of high impurity concentration, namely the p$^+$ base 13, exists between the source electrode 20 and the p base region 12. Thus, even if a charge accumulates unexpectedly, for example, in the vicinity of the insulating film 29 between the source electrode 20 and the floating electrode 28, and an inversion layer is formed in the surface portion of the p base region 12 due to the effect thereof, the inversion layer will be stopped at the p$^+$ base 13, thereby reducing the leakage current.

Moreover, as illustrated in FIG. 8, the region located on the outer side of the n drift region 11 is the second drain region 16. In the seventh embodiment, since an n$^+$ punch-through stopper region 22 is provided adjacent to the second drain region 16 in the similar manner as in the first embodiment (see FIG. 9 or 10), the second drain region 16 also is not depleted during the application of a breakdown voltage, but is biased approximately at the drain potential. Therefore, in the seventh embodiment as illustrated in FIGS. 8 and 10, it is unnecessary to provide the edges in the outer periphery of the device (in FIG. 8, the 3 edges at the top, bottom and right), at which the second drain region 16 terminates, with a breakdown withstanding structure, such as the above-noted structure on the edge facing the n$^+$ source region 14. Even though unnecessary, a breakdown withstanding structure can be provided on the edges that are terminal ends of the second drain region 16. Moreover, in the case where the n$^+$ source region 14 faces a plurality of edges, a breakdown withstanding structure can be formed along each edge. Furthermore, if the n$^+$ punch-through stopper region 22 is absent, not only the edges facing n$^+$ source region 14, but also the edges facing the second drain region 16 can have a breakdown withstanding structure.

Moreover, as illustrated in FIG. 8, the gate wire 25 and the gate electrode 19 are interconnected at arbitrary locations. In FIG. 8, the connection points between the gate wire 25 and the gate electrode 19 are indicated by the symbol "X" (other figures also use the same symbol). Accordingly, the distances along the wiring path of the gate electrode 19 are shortened and propagation delay can be eliminated for gate signals transmitted along the continuous wiring path of the gate electrode 19 from a gate driving power source to a MOSFET located a distance away. In order to connect the gate electrode 19 securely and with low resistance over a wide range, as illustrated in FIG. 8, the gate wire 25 and the gate electrode 19 are connected in a mesh-like configuration, and it is effective to connect the gate wire 25 such that several closed loops are formed.

According to the above-noted seventh embodiment, the MOSFET is arranged in a stripe-like configuration, and since the ends of adjacent stripe segments are curved or bent and connected to adjoining segments, each segment of a stripe does not have a terminal end with the exception of both ends of the stripe. This has the effect of making it easy to avoid the concentration of an electric field during application of a breakdown voltage. Moreover, since it is unnecessary to provide a breakdown withstanding structure on the edges in the outer periphery of the device that are terminal ends of second drain region 16, the region allocated for the breakdown withstanding structure becomes unnecessary, enabling a reduction in size by the volume of that unnecessary region.

Figure 11:
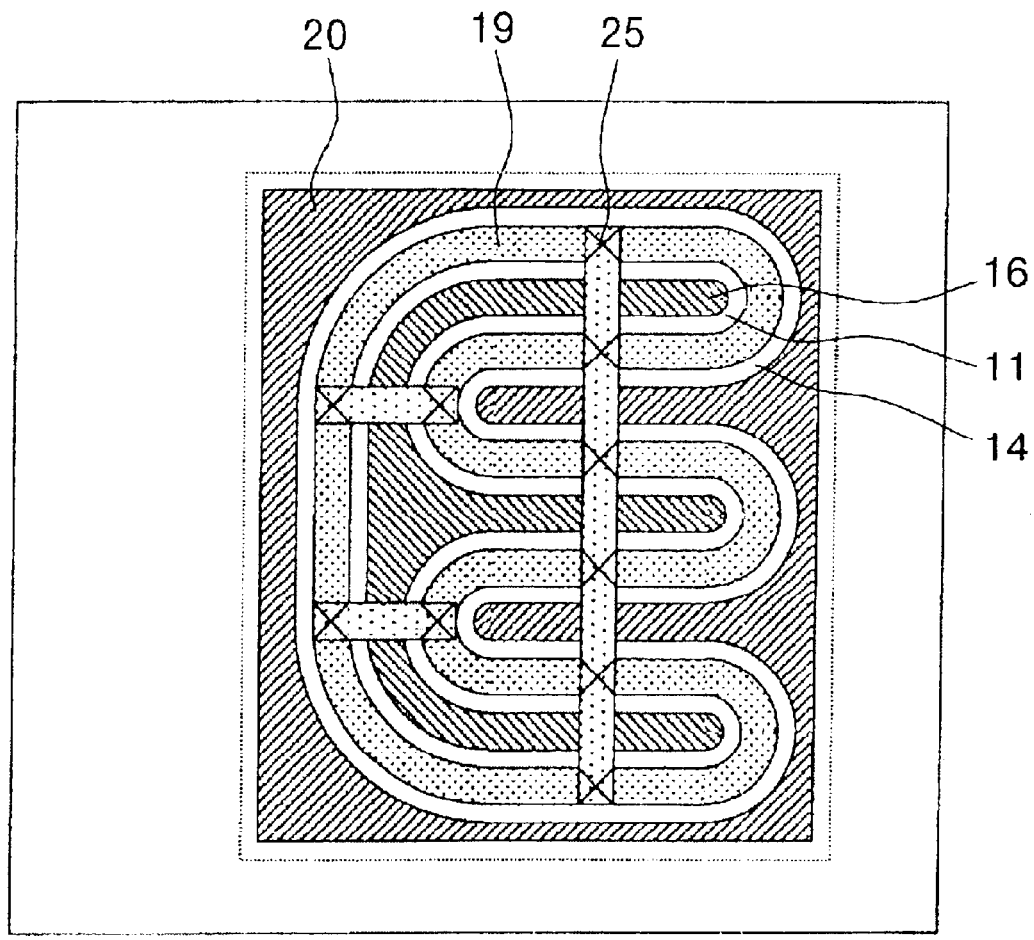
FIG. 11 is a plan view that illustrates a two-dimensional layout of the main part of the semiconductor device according to an eighth embodiment of the present invention.

FIG. 11 is a plan view that illustrates a two-dimensional layout of the main part of the semiconductor device according to an eighth embodiment of the present invention. As illustrated in FIG. 11, the MOSFET according to the eighth embodiment is arranged in a stripe-like configuration and the ends of adjacent stripe segments are curved or bent and connected to adjoining segments. Accordingly, the MOSFET has a closed-loop pattern in which both ends of a stripe are curved or bent and connected. Consequently, the electric field concentration caused by the terminal end effect during application of a breakdown voltage at the end of each stripe segment is completely eliminated. Moreover, in the eighth embodiment, the n$^+$ source region 14 is disposed on the outer side and the second drain region 16 is disposed on the inner side of the MOSFET loop pattern. Accordingly, in the case of a configuration that utilizes a MOSFET in which the source is connected to the ground, the regions around the annular pattern are biased at the ground potential, and therefore, if a MOSFET driving circuit is provided on the same semiconductor device, electrical separation between the MOSFET and the driving circuit can be achieved easily.

Figure 12:
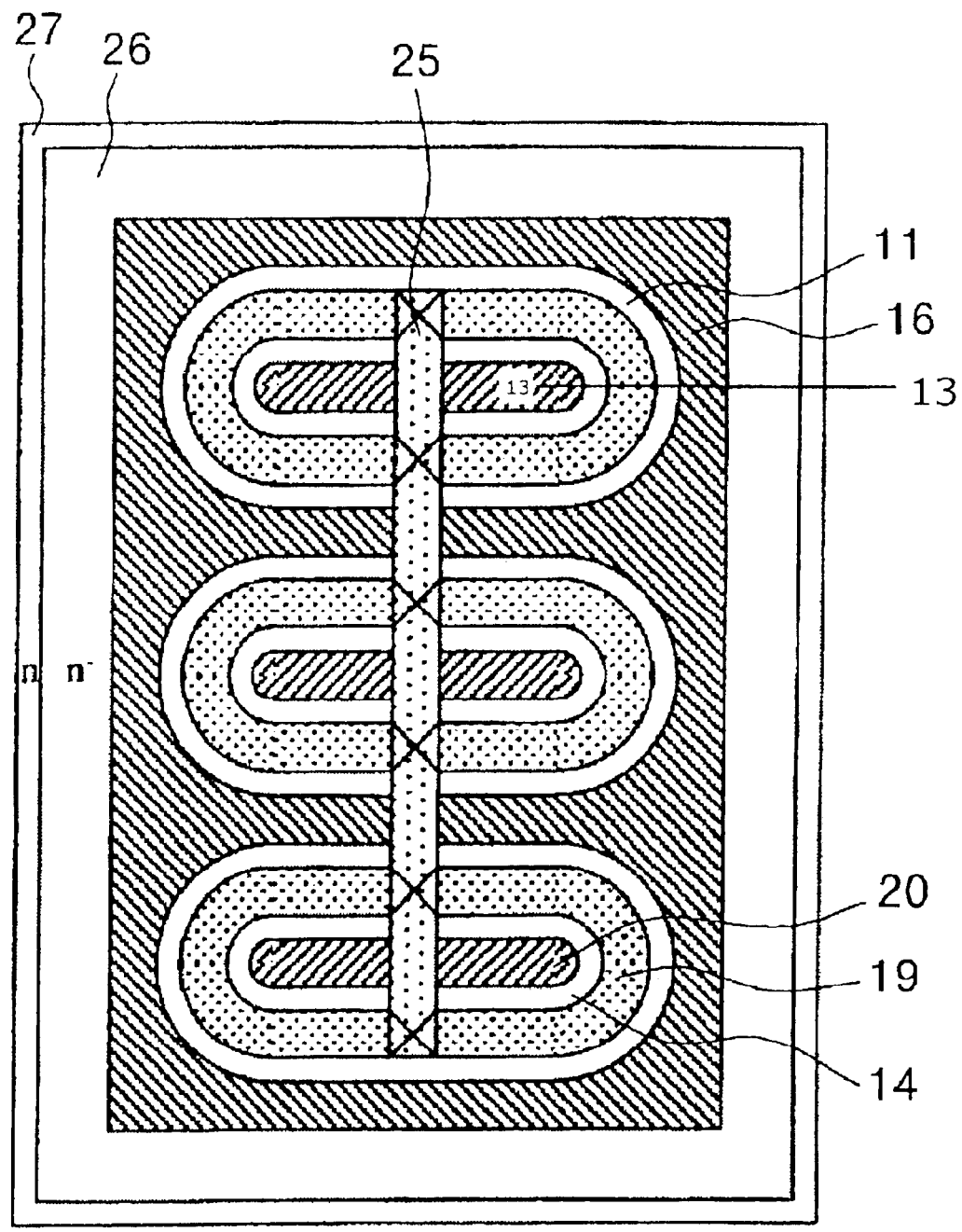
FIG. 12 is a plan view that illustrates a two-dimensional layout of the main part of the semiconductor device according to a ninth embodiment of the present invention.
Figure 13:
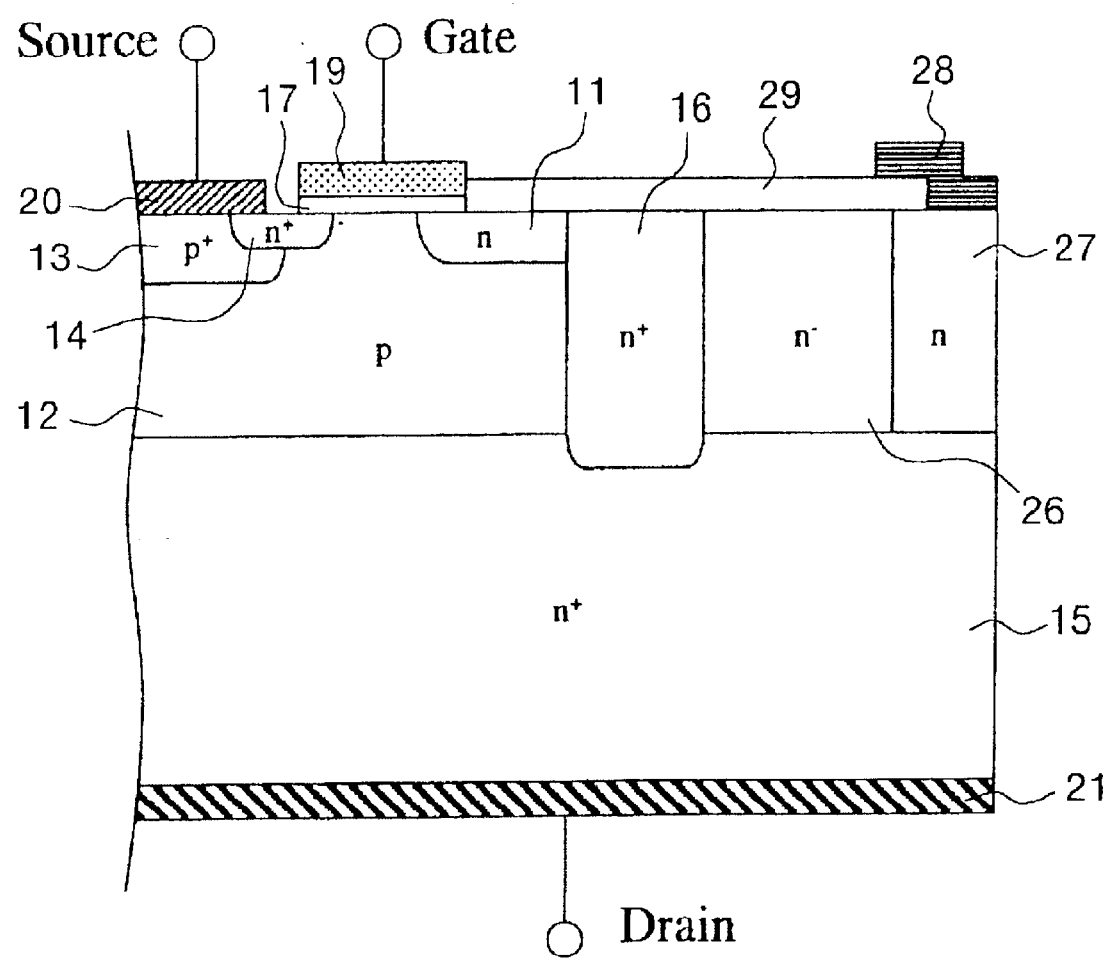
FIG. 13 is a cross-sectional view that illustrates the structure of the device end section along line segment 13—13 of FIG. 12.

FIG. 12 is a plan view that illustrates a two-dimensional layout of the main part of the semiconductor device according to a ninth embodiment of the present invention. FIG. 13 is a cross-sectional view that illustrates the structure of the device end section taken along line 13—13 of FIG. 12. The floating electrode 28 and the insulating film 29 are omitted from FIG. 12. FIG. 12 illustrates the semiconductor device according to the ninth embodiment in which a plurality of MOSFETs, each having an annular or looped pattern, are arranged.

Here, the MOSFET annular pattern, as viewed from the second major surface of the semiconductor device, can have a simple shape, such as a circle, an ellipse, a skewed shape thereof, a triangle, a square, or a hexagon, for example. In the example illustrated in FIG. 12, the annular patterns have a racetrack-like or oval shape. When performing the computer-aided design of masks, etc., for this type of simple pattern, a drawing can be prepared by simply executing several predefined line segment and arc drawing commands in combination. Especially in the case of a circle or regular polygon, the drawing can be prepared quickly by simply executing commands such as copy, rotate and invert after drawing a portion of that shape.

Moreover, in the case where a plurality of such structures are provided on a single device, considering an annular MOSFET to be a single structure as according to the ninth embodiment, it is preferable for each annular pattern to have a congruent shape. In this manner, the design of masks, etc., will be simplified. Additionally, it is desirable for the arrangement of congruently-shaped annular patterns to be regular and periodic. In this manner, a plurality of annular patterns can be arranged without waste on a single device and the problem of unstable device characteristics due to anisotropism can be avoided. Of course, a mixed arrangement that includes a MOSFET structures as described in connection with the seventh and eighth embodiments also can be used.

Moreover, the second drain region 16 in the ninth embodiment can be disposed at the outer side of the annular MOSFET, but the n⁺ punch-through stopper region 22 is not provided as shown in FIGS. 12 and 13. Therefore, a highly resistive n⁻ breakdown withstanding region 26 is provided adjacent to the second drain region 16, and an n outer periphery region 27 and he floating electrode 28 can be provided on the outside thereof. With this type of a breakdown withstanding structure, the depletion layer is able to extend sufficiently beyond the second drain region 16 to the n⁻ breakdown voltage region 26 during application of a breakdown voltage to ensure a stable breakdown withstanding capability. In the ninth embodiment, if used as a single MOSFET, the outer periphery of the semiconductor device will be nearly at the drain potential, and therefore, a peripheral breakdown withstanding structure can easily be designed.

Figure 14:
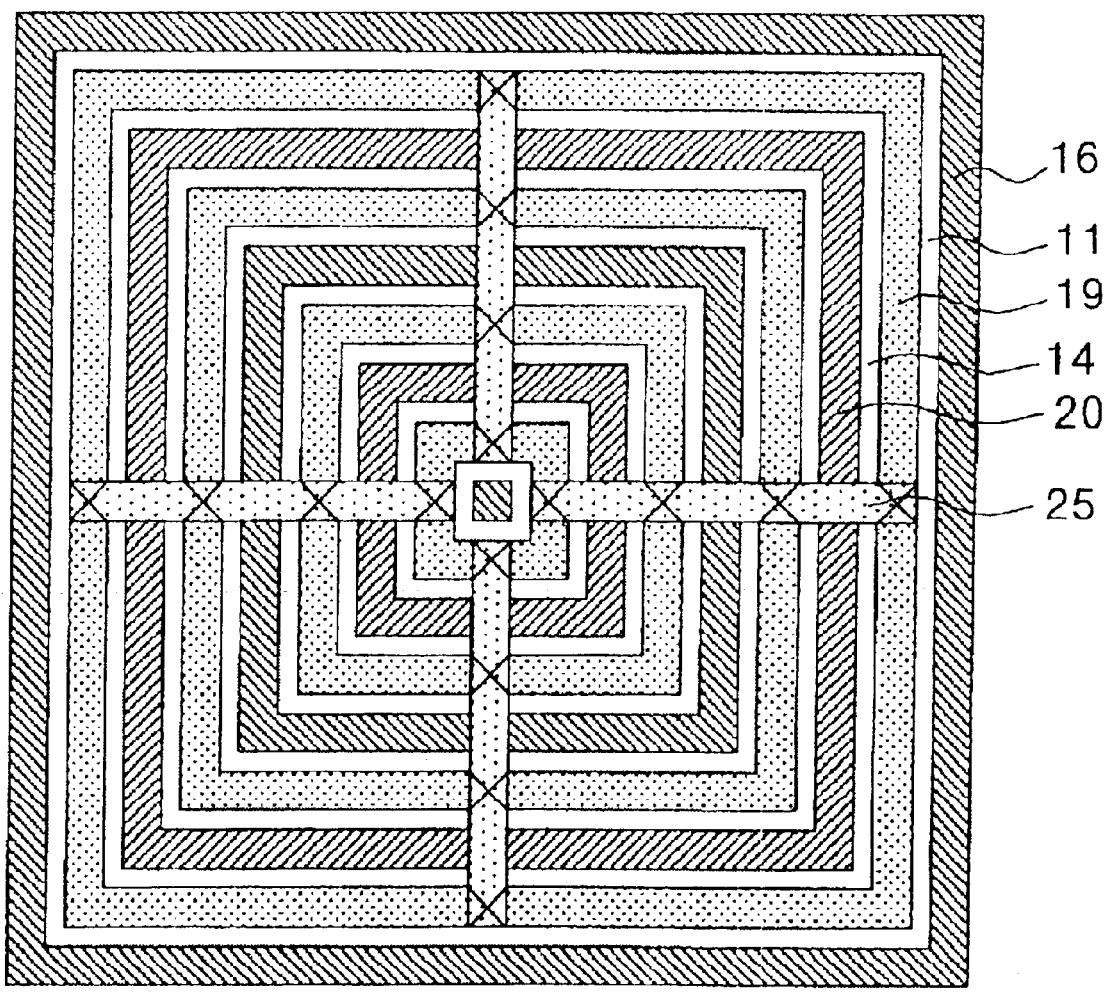
FIG. 14 is a plan view that illustrates a two-dimensional layout of the main part of the semiconductor device according to a tenth embodiment of the present invention.

FIG. 14 is a plan view that illustrates a two-dimensional layout of the main part of the semiconductor device according to a tenth embodiment of the present invention. As illustrated in FIG. 14, viewing from the second major surface of the semiconductor device, MOSFETs having an annular pattern comprised of a plurality of different sized squares can be arranged concentrically according to the tenth embodiment. The example illustrated in the drawing is comprised of the following elements in sequence from the outer side: (1) second drain region 16, (2) n drift region 11, (3) gate electrode 19, (4) n⁺ source region 14, (5) source electrode 20, (6) n⁺ source region 14, (7) gate electrode 19, (8) n drift region 11, (9) second drain region 16, (10) n drift region 11, (11) gate electrode 19, (12) n⁺ source region 14, (13) source electrode 20, (14) n⁺ source region 14, (15) gate electrode 19, (16) n drift region 11, and (17) second drain region 16.

Of elements (1) to (17) above, elements (1) to (5) constitute an outermost first annular MOSFET, the elements (5) to (9) constitute a second annular MOSFET, elements (9) to (13) constitute a third annular MOSFET, and elements (13) to (17) constitute an innermost fourth annular MOSFET. By arranging highly symmetric and concentric annular patterns in the manner as described above, the patterns are spaced at periodic or regular intervals in the radial direction. Therefore, the design can be easily accomplished. Although, FIG. 14 does not illustrate the n⁺ punch-through stopper region 22, the embodiment of FIG. 14 includes it as a peripheral breakdown withstanding structure, similar to that shown in FIG. 10. If the stopper region 22 is omitted other peripheral breakdown withstanding structure is necessary.

Figure 15:
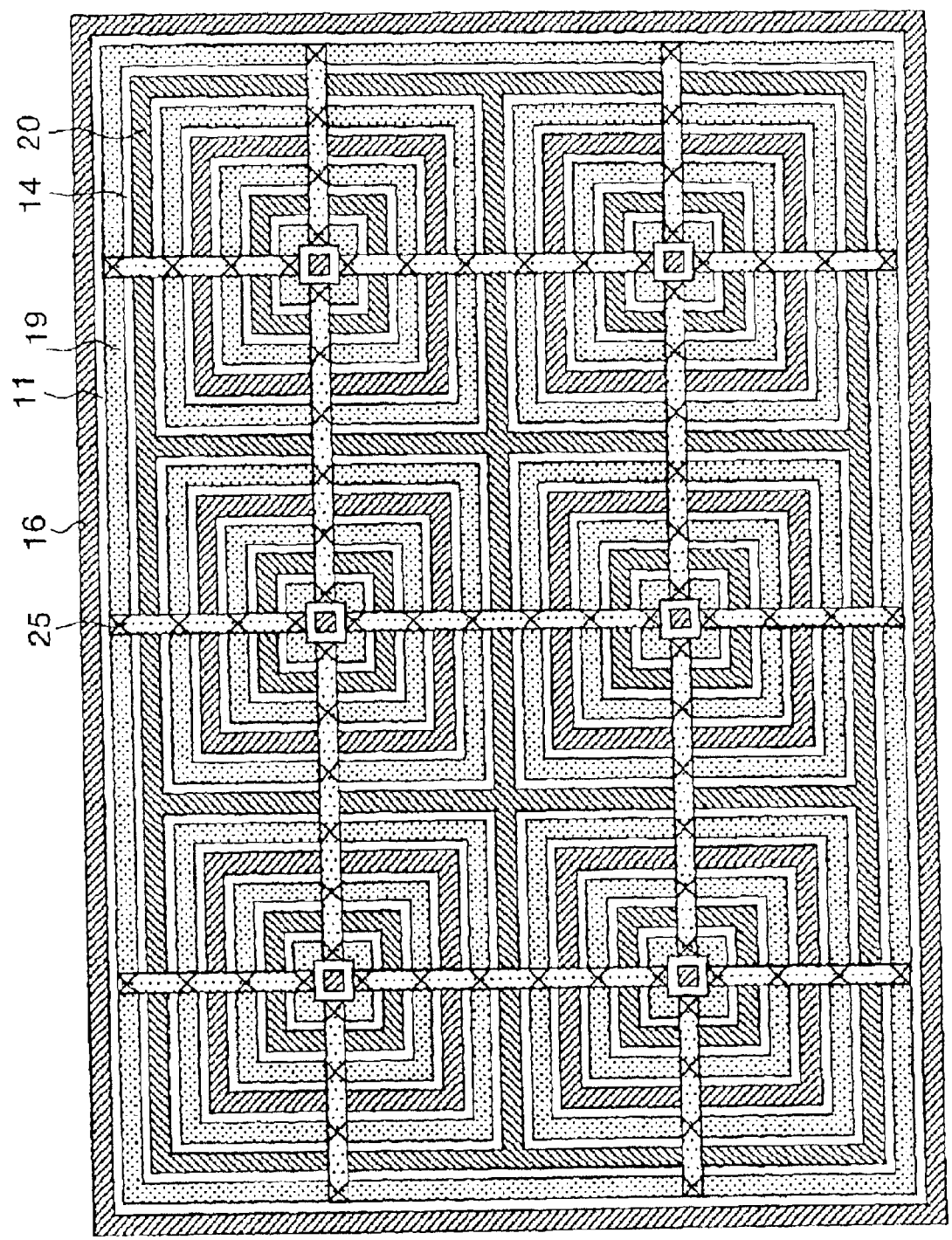
FIG. 15 is a plan view that illustrates a two-dimensional layout of the main part of the semiconductor device according to an eleventh embodiment of the present invention.

FIG. 15 is a plan view that illustrates a two-dimensional layout of the main part of the semiconductor device according to an eleventh embodiment of the present invention. As illustrated in FIG. 15, the basic structure is a pattern similar to that of the tenth embodiment and a plurality of these basic structures are arranged in the shape of a tetragonal lattice. The example in FIG. 15 shows a configuration comprised of six basic structures. However, no particular limitation is specified. In this type of configuration comprised of a plurality of basic structures, there is a greater degree of freedom for the design. Similarly, as in the previous embodiment, the n⁺ punch-through stopper region 22 is provided in the embodiment of FIG. 15, but not illustrated.

In the above-noted eleventh embodiment, the final form that combines a plurality of basic MOSFET structures is called the cell structure. The following descriptions of twelfth through seventeenth embodiments are examples in which the two-dimensional arrangement of the semiconductor device, as viewed from the second major surface, is comprised of a plurality of the basic MOSFET structures, wherein the basic MOSFET structure is comprised of an extremely minute cell. Therefore, the following descriptions only concern the arrangement of the basic MOSFET structure. Moreover, the relevant diagrams (FIGS. 16 to 21) only show the main part relating to the arrangement of basic MOSFET structures. In particular, gate wires, peripheral breakdown withstanding structures, etc., are not shown, but they are provided similarly as in each of the above-noted embodiments. The configurations according to the twelfth through seventeenth embodiments are also similarly applicable to the case where the basic structure is macro-sized.

Figure 16:
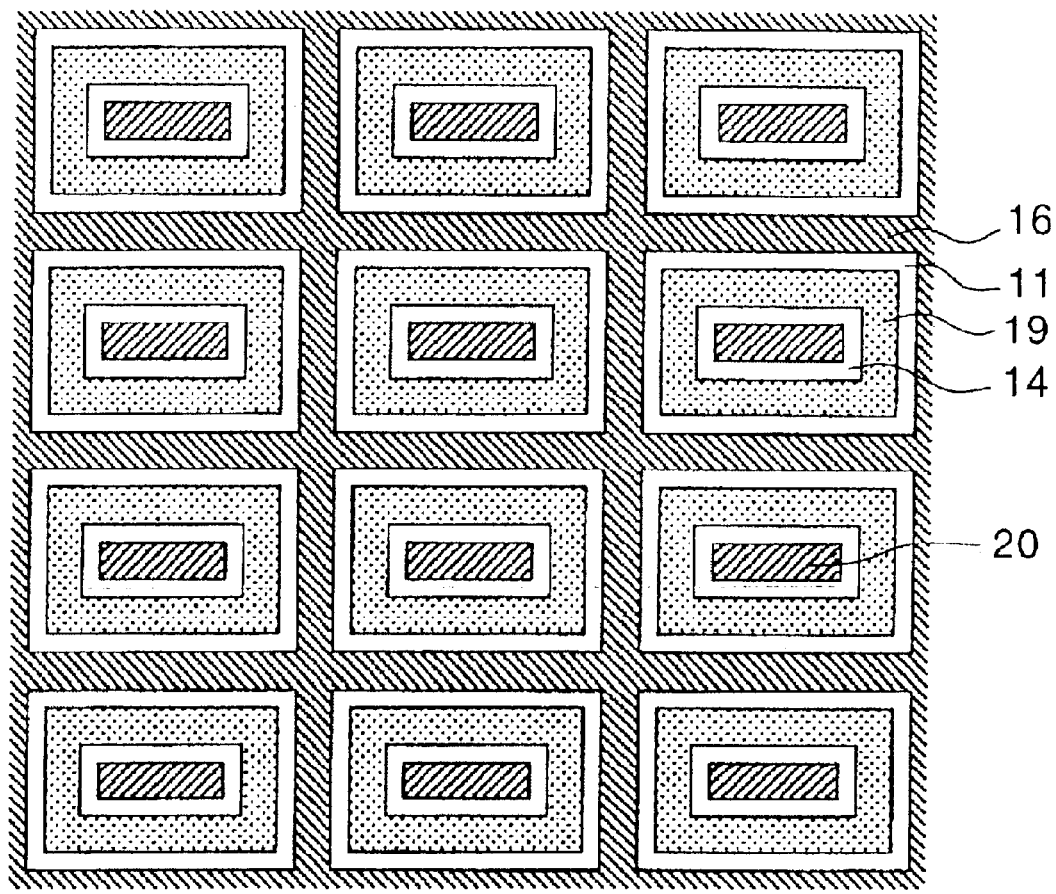
FIG. 16 is a plan view that illustrates a two-dimensional layout of the main part of the semiconductor device according to a twelfth embodiment of the present invention.

FIG. 16 is a plan view that illustrates a two-dimensional layout of the main part of the semiconductor device according to a twelfth embodiment of the present invention. As illustrated in FIG. 16, the semiconductor device according to the twelfth embodiment has a basic structure of a rectangular cell, a plurality of which are arranged in the shape of a quadrilateral lattice. This embodiment enables MOSFET structures to be spread over the semiconductor device without waste.

Figure 17:
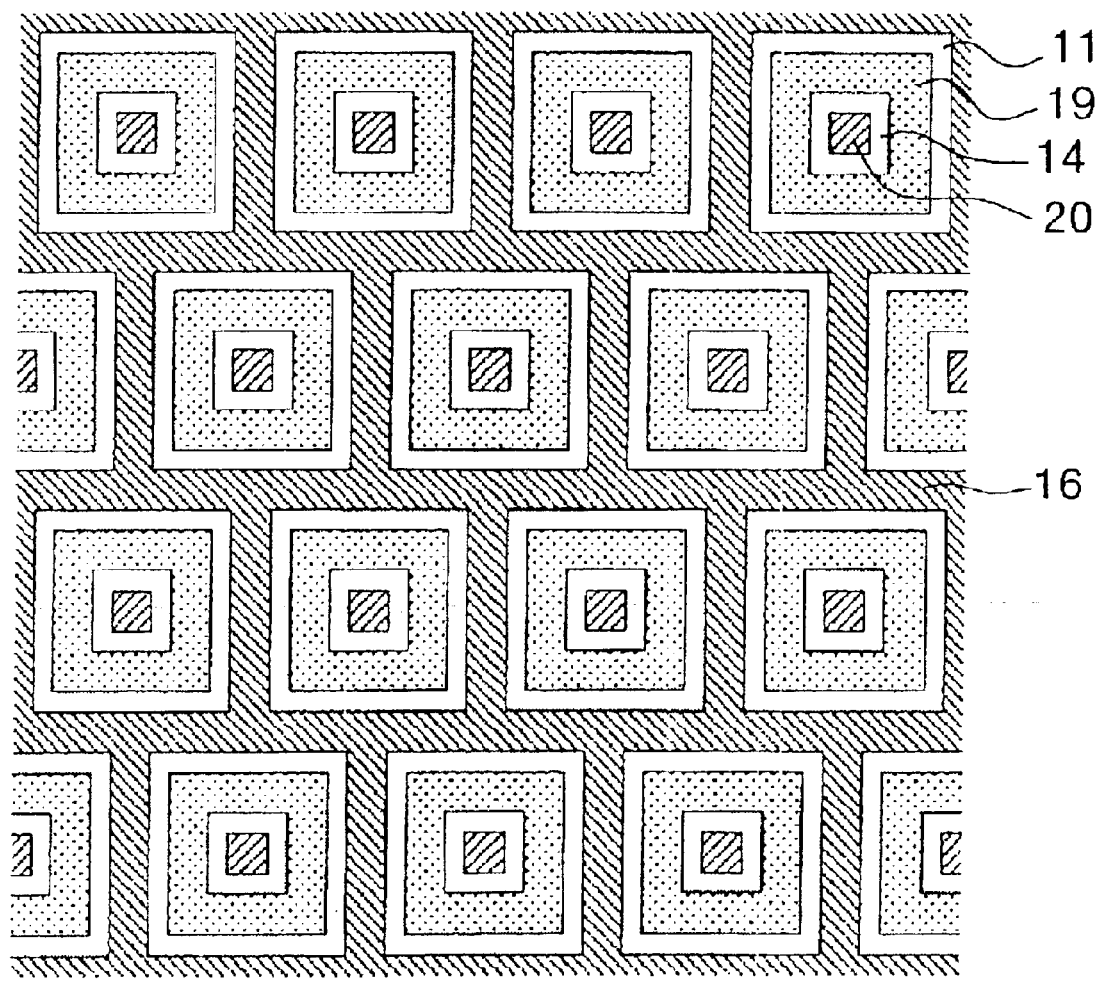
FIG. 17 is a plan view that illustrates a two-dimensional layout of the main part of the semiconductor device according to a thirteenth embodiment of the present invention.

FIG. 17 is a plan view that illustrates a two-dimensional layout of the main part of the semiconductor device according to a thirteenth embodiment of the present invention. As illustrated in FIG. 17, the semiconductor device according to the thirteenth embodiment has a basic structure of a square cell, a plurality of which are arranged in the shape of a triangular lattice. In this example, because the cell basic structure is highly symmetrical, the design is easy to accomplish.

Figure 18:
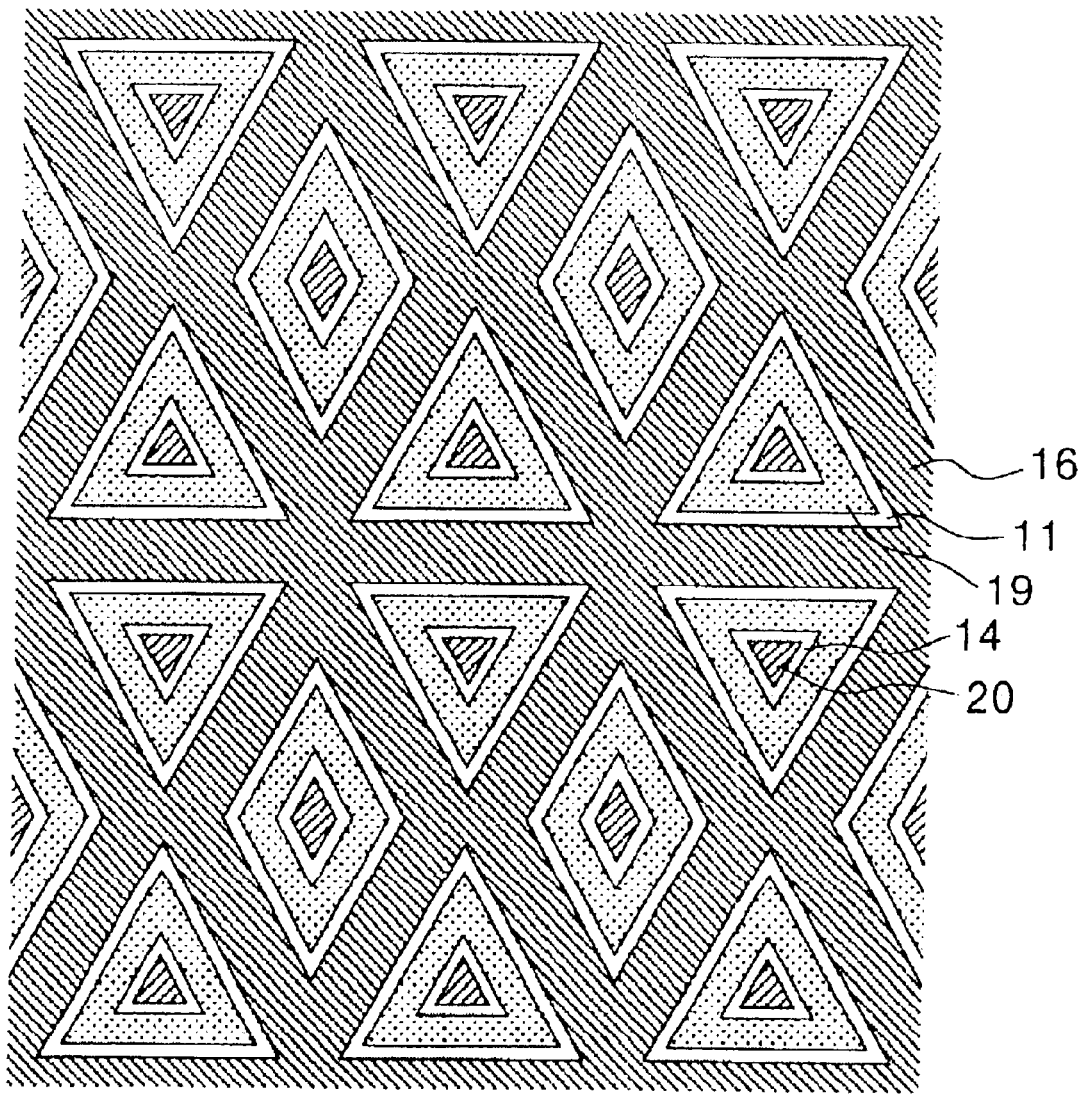
FIG. 18 is a plan view that illustrates a two-dimensional layout of the main part of the semiconductor device according to a fourteenth embodiment of the present invention.

FIG. 18 is a plan view that illustrates a two-dimensional layout of the main part of the semiconductor device according to a fourteenth embodiment of the present invention. In the semiconductor device according to the fourteenth embodiment illustrated in FIG. 18, a plurality of first basic structures including an equilateral triangular cell and a plurality of second basic structures including a diamond-shaped cell are each arranged into a quadrilateral lattice. By combining individual basic structures, which are cells having a plurality of different shapes, and aligning them into a lattice shape in the manner as described above, wasted space on the semiconductor device can be decreased.

Figure 19:
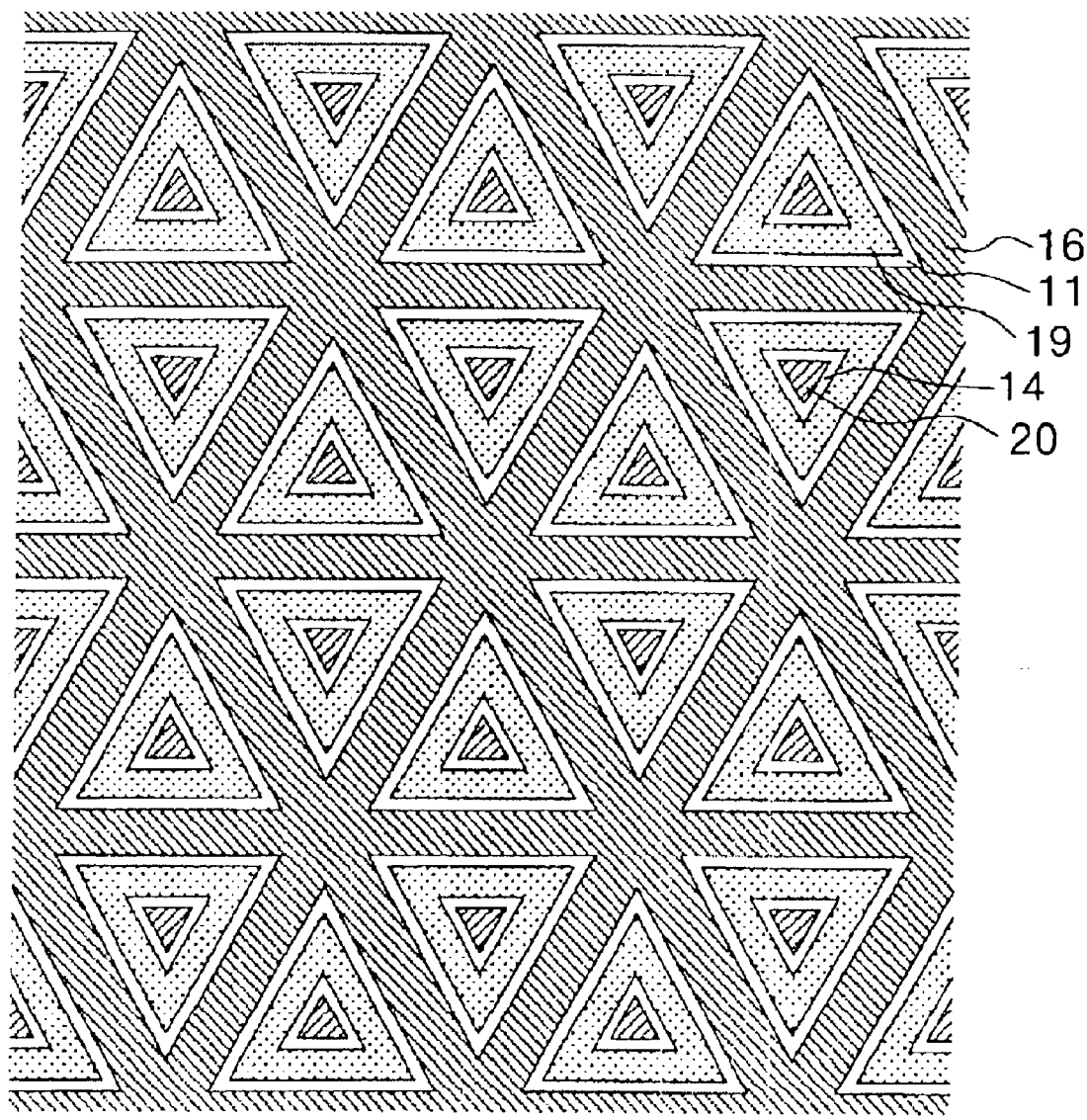
FIG. 19 is a plan view that illustrates a two-dimensional layout of the main part of the semiconductor device according to a fifteen embodiment of the present invention.

FIG. 19 is a plan view that illustrates a two-dimensional layout of the main part of the semiconductor device according to a fifteenth embodiment of the present invention. As illustrated in FIG. 19, the semiconductor device according to the fifteenth embodiment has a basic structure of an equilateral triangular cell, a plurality of which are arranged in the shape of a regular hexagonal lattice. In this manner, by appropriately selecting the cell shape of the basic structure and the shape of lattice in which the basic structures are arranged, both can be made highly symmetric. Higher symmetry has the advantages of being easier to design and, because anisotropy is decreased throughout the entire device, of being less prone to problems due to non-uniform operation.

Figure 20:
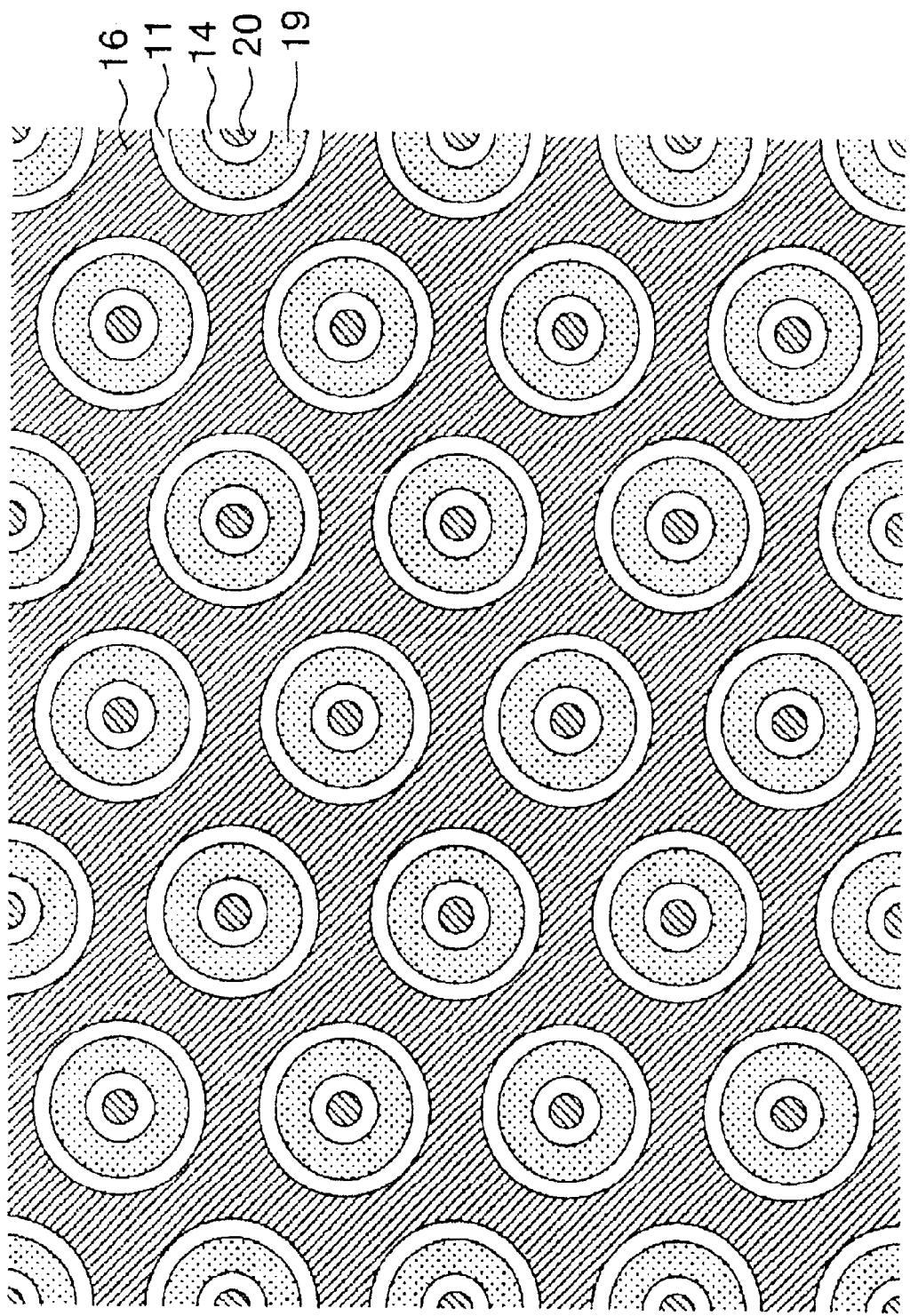
FIG. 20 is a plan view that illustrates a two-dimensional layout of the main part of the semiconductor device according to a sixteenth embodiment of the present invention.

FIG. 20 is a plan view that illustrates a two-dimensional layout of the main part of the semiconductor device according to a sixteenth embodiment of the present invention. As illustrated in FIG. 20, the semiconductor device according to the sixteenth embodiment has a basic structure of a circular cell, a plurality of which are arranged in the shape of an equilateral triangular lattice. In this manner, there is a high degree of symmetry across the entire device in the similar manner as according to the fifteenth embodiment. In particular, since the basic structure is a circle, it is isotropic over its 360° circumference, and consequently, characteristics such as the on current and electric field during application of a breakdown voltage are uniformly distributed. Moreover, there is a high degree of design freedom for arranging the cells.

FIG. 21 is a plan view that illustrates a two-dimensional layout of the main part of the semiconductor device according to a seventeenth embodiment of the present invention. As illustrated in FIG. 21, the semiconductor device according to the seventeenth embodiment has a basic structure of a regular hexagonal cell, a plurality of which are arranged in the shape of an equilateral triangular lattice. In this manner, similar to the fifteenth and sixteenth embodiments, there is a high degree of symmetry across the entire device. Moreover, each cell having a hexagonal shape has a long perimeter and is therefore extremely effective in reducing the on-resistance. Furthermore, in the semiconductor device illustrated in FIG. 21 where the second drain region 16 is inside the cell and the n$^+$ source region 14 is at the outer side of the cell, the capacitance of the insulating film does not contribute as feedback capacitance even if a cell-to-cell connecting gate wire (not shown in the drawing) is above the insulating film, and therefore this cell arrangement is advantageous for high-speed switching.

In the above, the present invention is not limited to the above-noted embodiments and various modifications are possible. For example, a configuration may be adopted in which the inside of the trench is filled with the second drain region 16 and then embedded additionally with a lightly doped n semiconductor material. In this manner, the depletion layer extends to the interior of the trench and a desired breakdown voltage can be ensured. Moreover, in the case where the second drain region 16 is provided along the trench sidewall, a configuration may be adopted in which the second drain region 16 is also provided inside the trench to reduce the on-resistance even further. Furthermore, in the case where the second drain region 16 is provided along the trench sidewall, a configuration that expands the second drain region 16 can be adopted by filling a portion or the entirety of the trench interior with a highly conductive semiconductor material. In this manner as well, the on-resistance can be reduced.

According to the present invention, a drift region and a first drain region can be connected with low resistance in a small area, thereby decreasing the on-resistance. Moreover, because the area of overlap between the drift region and the gate electrode is reduced, the switching speed is increased. Accordingly, the relation between the on-resistance and the switching time is greatly improved and a MIS semiconductor device is provided that maintains high-speed switching characteristics while achieving low on-resistance.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

The disclosures of the priority applications, JP 2002-146863 and JP 2002-298069, in their entirety, including the drawings, claims, and the specification thereof, are incorporated herein by reference.

What is claimed is:

1. A MIS semiconductor device comprising:
   a semiconductor substrate having a first major side and a second major side;
   a first drain region of a first conductivity-type provided on the first major side of the semiconductor substrate;
   a base region of a second conductivity-type provided on the second major side of the semiconductor substrate;
   a source region of the first conductivity-type selectively formed in the surface portion of the base region;
   a gate insulating film disposed on the surface of the base region;
   a gate electrode provided on the gate insulating film; and
   a second drain region disposed in the base region, adjacent to the gate electrode,
   wherein the second drain region extends from the surface of the base region to the first drain region.

2. The MIS semiconductor device of claim 1, wherein the second drain region serves as a drift region, and wherein the gate electrode is provided adjacent to the source region, and between the source region and the second drain region.

3. The MIS semiconductor device of claim 1, wherein the second drain region is composed of a heavily doped semiconductor material of the first conductivity-type, a polycrystalline semiconductor material, or metal.

4. The MIS semiconductor device of claim 1, further including an insulation region in the second drain region.

5. The MIS semiconductor device of claim 4, further including a highly conductive region embedded in the insulation region.

6. The MIS semiconductor device of claim 5, wherein the highly conductive region contacts the source electrode.

7. The MIS semiconductor device of claim 5, wherein the highly conductive region is adapted to receive a gate potential.

8. The MIS semiconductor device of claim 5, wherein the thickness of the insulation region between the highly conductive region and the second drain region is thicker than the thinnest part of the gate insulating film.

9. The MIS semiconductor device of claim 1, further including a drift region of the first conductivity-type disposed in the surface portion of the base region, and the second drain region extending through the drift region.

10. The MIS semiconductor device of claim 9, wherein the second drain region comprises a heavily doped semiconductor material of the first conductivity-type, a polycrystalline semiconductor material, or metal.

11. The MIS semiconductor device of claim 9, further including an insulation region in the second drain region.

12. The MIS semiconductor device of claim 11, further including a highly conductive region embedded in the insulation region.

13. The MIS semiconductor device of claim 12, wherein the highly conductive region contacts the source electrode.

14. The MIS semiconductor device of claim 12, wherein the highly conductive region is adapted to receive a gate potential.

15. The MIS semiconductor device of claim 12, wherein the thickness of the insulation region between the highly conductive region and the second drain region is thicker than the thinnest part of the gate insulating film.

16. The MIS semiconductor device of claim 9, wherein the second drain region extends completely through the first drain region to contact a drain electrode formed on the first major side of the semiconductor substrate.

17. A method of manufacturing a MIS semiconductor device comprising the steps of:
providing a semiconductor substrate with a first drain region of a first conductivity-type on a first major side thereof;
forming a base region of a second conductivity-type on a second major side of the semiconductor substrate;
forming a source region of the first conductivity-type selectively in the surface portion of the base region;
forming a gate insulating film on the surface of the base region,
forming a gate electrode on the gate insulating film; and
forming a trench that extends from the second major side of the semiconductor substrate to the first drain region at a position in the base region adjacent to the gate electrode; and forming a second drain region in the trench,
wherein the second drain region extends from the surface of the base region to the first drain region.

18. The method of claim 17, wherein the second drain region is aligned relative to the gate electrode and formed by implanting ions of an impurity of the first conductivity-type using the gate electrode as a mask.

19. The method of claim 17, further including the step of forming a drift region of the first conductivity type in the surface portion of the base region before forming the trench, wherein the trench is formed through the drift region and the second drain region is partly formed in the trench.

20. The method of claim 19, wherein the drift region is aligned relative to the gate electrode and formed by implanting ions of an impurity of the first conductivity-type using the gate electrode as a mask.

* * * * *